United States Patent
Yoshizumi et al.

(10) Patent No.: US 8,488,642 B2
(45) Date of Patent: Jul. 16, 2013

(54) GALLIUM NITRIDE BASED SEMICONDUCTOR LIGHT-EMITTING DEVICE AND METHOD FOR FABRICATING THE SAME, GALLIUM NITRIDE BASED LIGHT-EMITTING DIODE, EPITAXIAL WAFER, AND METHOD FOR FABRICATING GALLIUM NITRIDE LIGHT-EMITTING DIODE

(75) Inventors: Yusuke Yoshizumi, Itami (JP); Yohei Enya, Itami (JP); Masaki Ueno, Itami (JP); Takashi Kyono, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/082,101

(22) Filed: Apr. 7, 2011

(65) Prior Publication Data
US 2011/0182311 A1    Jul. 28, 2011

Related U.S. Application Data

(63) Continuation of application No. PCT/JP2009/067410, filed on Oct. 6, 2009.

(30) Foreign Application Priority Data

Oct. 7, 2008  (JP) ................. 2008-260823
Jul. 14, 2009 (JP) ................. 2009-165982

(51) Int. Cl.
*H01S 5/00* (2006.01)
*H01S 5/02* (2006.01)

(52) U.S. Cl.
USPC ................. 372/44.011; 372/45.011

(58) Field of Classification Search
USPC .................................. 372/44.011
See application file for complete search history.

(56) References Cited

U.S. PATENT DOCUMENTS 6,072,197 A    6/2000  Horino et al.
6,614,059 B1   9/2003  Tsujimura et al.
(Continued)

FOREIGN PATENT DOCUMENTS

CN    1677778 A    10/2005
JP    10-135576 A2   5/1998
(Continued)

OTHER PUBLICATIONS

Masui et al., "Correlation between Optical Polarization and Luminescence Morphology of (11-22)-Oriented InGaN/GaN Quantum-Well Structures," Applied Physics Express 2, pp. 071002-1-071002-3 (2009).

*Primary Examiner* — Jessica Stultz
*Assistant Examiner* — Michael Carter
(74) *Attorney, Agent, or Firm* — Venable LLP; Michael A. Sartori; Tamatane J. Aga

(57) ABSTRACT

Provided is a gallium nitride based semiconductor light-emitting device with a structure capable of enhancing the degree of polarization. A light-emitting diode 11a is provided with a semiconductor region 13, an InGaN layer 15 and an active layer 17. The semiconductor region 13 has a primary surface 13a having semipolar nature, and is made of GaN or AlGaN. The primary surface 13a of the semiconductor region 13 is inclined at an angle α with respect to a plane Sc perpendicular to a reference axis Cx which extends in a direction of the [0001] axis in the primary surface 13a. The thickness $D_{13}$ of the semiconductor region 13 is larger than the thickness $D_{InGaN}$ of the InGaN layer 17, and the thickness $D_{InGaN}$ of the InGaN layer 15 is not less than 150 nm. The InGaN layer 15 is provided directly on the primary surface 13a of the semiconductor region 13 and is in contact with the primary surface 13a. The active layer 17 is provided on a primary surface 15a of the InGaN layer 15 and is in contact with this primary surface 15a. The active layer 17 includes well layers 21 of InGaN.

30 Claims, 21 Drawing Sheets

U.S. PATENT DOCUMENTS

| | | |
|---|---|---|
| 2003/0132448 A1 | 7/2003 | Tsujimura et al. |
| 2003/0168653 A1 | 9/2003 | Tsujimura et al. |
| 2005/0224783 A1 | 10/2005 | Matsuyama et al. |
| 2007/0002914 A1* | 1/2007 | Ryu et al. .................... 372/45.01 |
| 2007/0093073 A1* | 4/2007 | Farrell et al. .................. 438/763 |
| 2008/0023708 A1* | 1/2008 | Akita et al. ..................... 257/79 |
| 2008/0192788 A1 | 8/2008 | Matsuyama et al. |
| 2009/0059984 A1* | 3/2009 | Ohta et al. ............... 372/45.011 |
| 2009/0310640 A1* | 12/2009 | Sato et al. ................ 372/45.011 |

FOREIGN PATENT DOCUMENTS

| | | |
|---|---|---|
| JP | 2000-261106 A2 | 9/2000 |
| JP | 2005-206424 A2 | 8/2005 |
| JP | 2006-066869 A2 | 3/2006 |
| JP | 2007-234918 A2 | 9/2007 |
| WO | WO-2006/130696 A2 | 12/2006 |

* cited by examiner

Fig.5
(a)
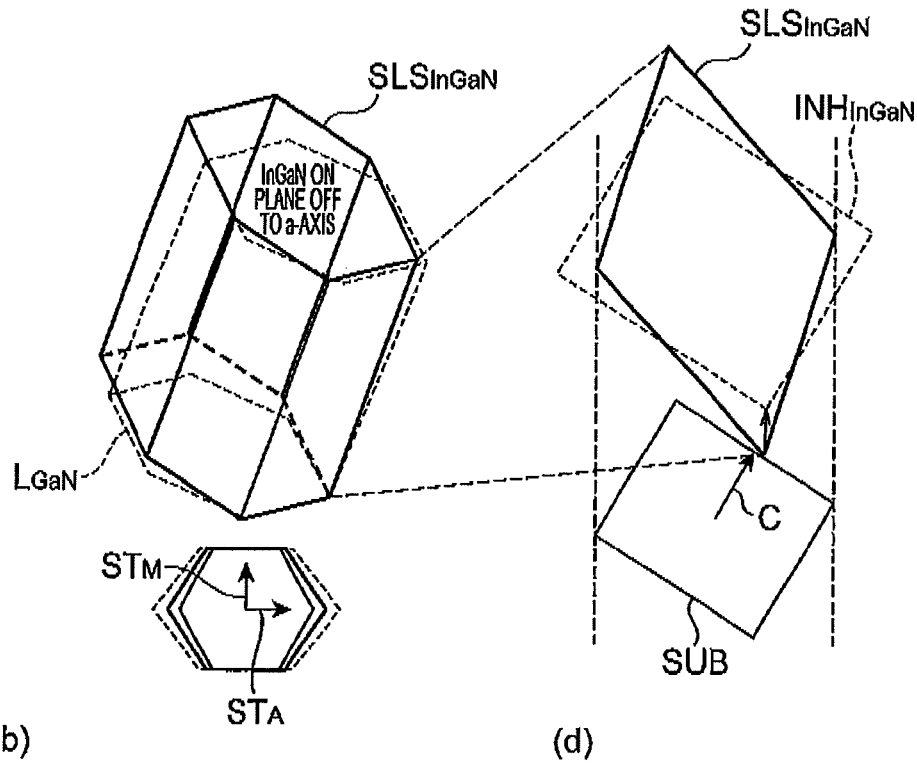
(c)
(b)
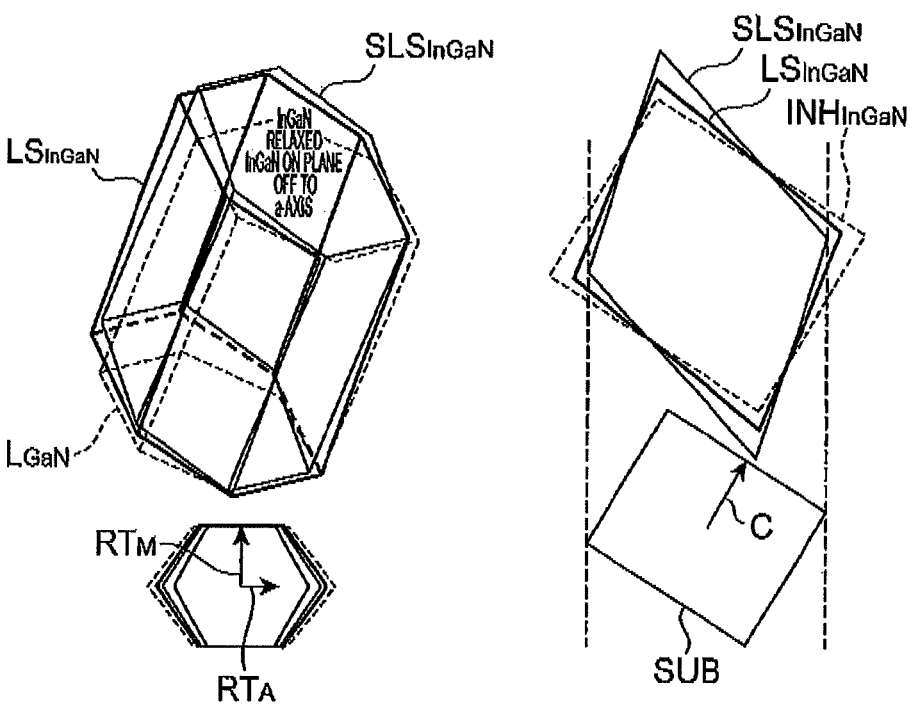
(d)

Fig.6
(a)
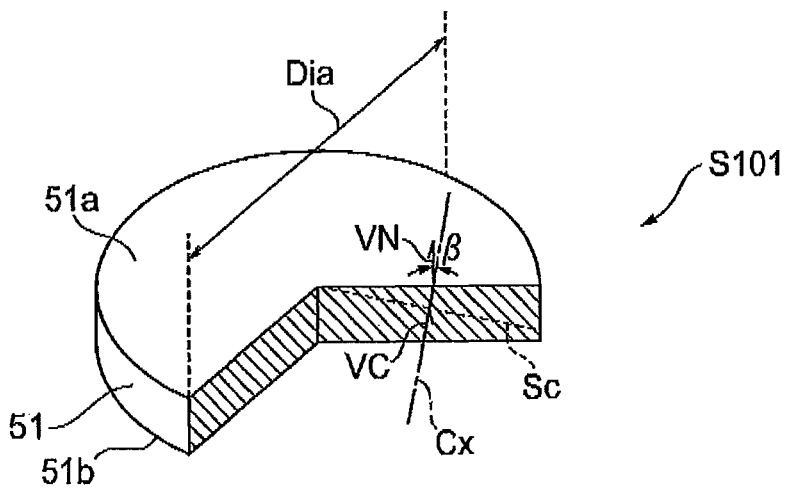
(b)
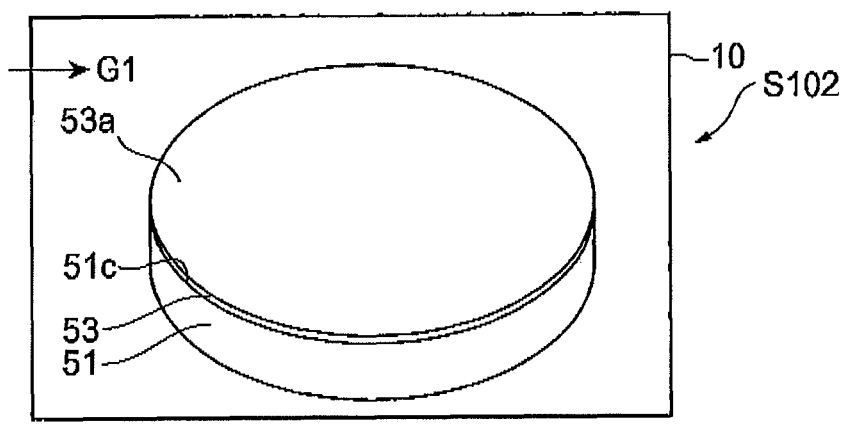
(c)
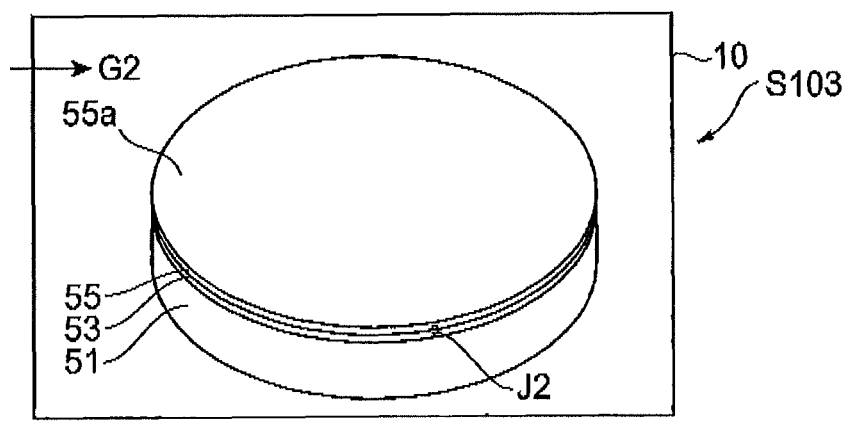

Fig.8
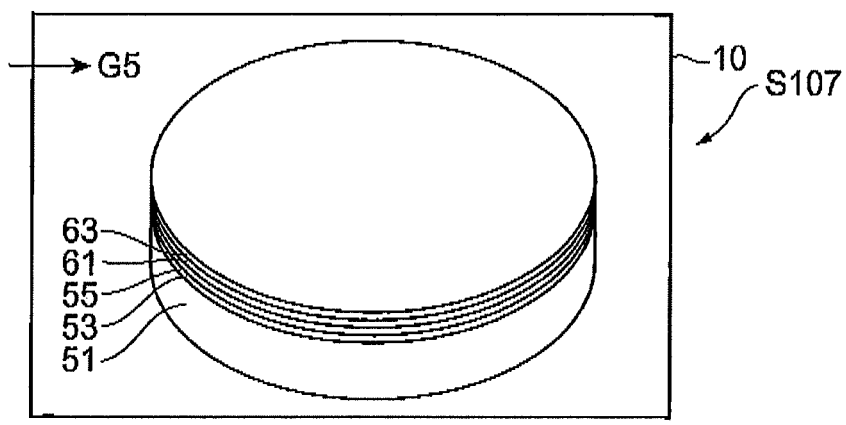
(a)
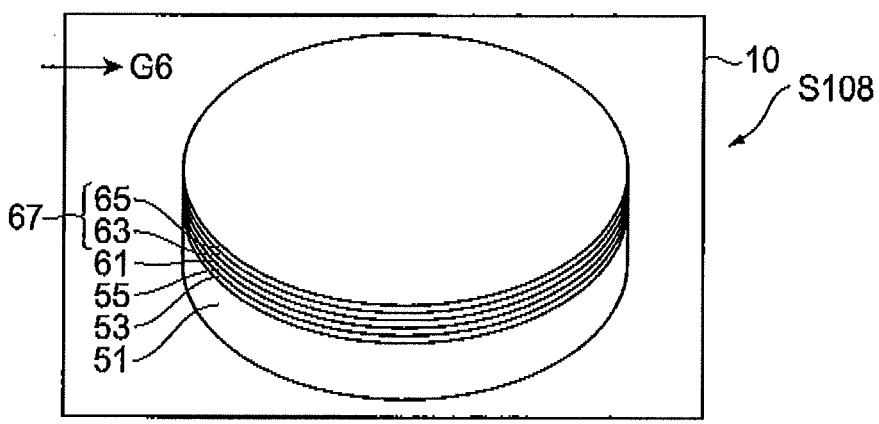
(b)
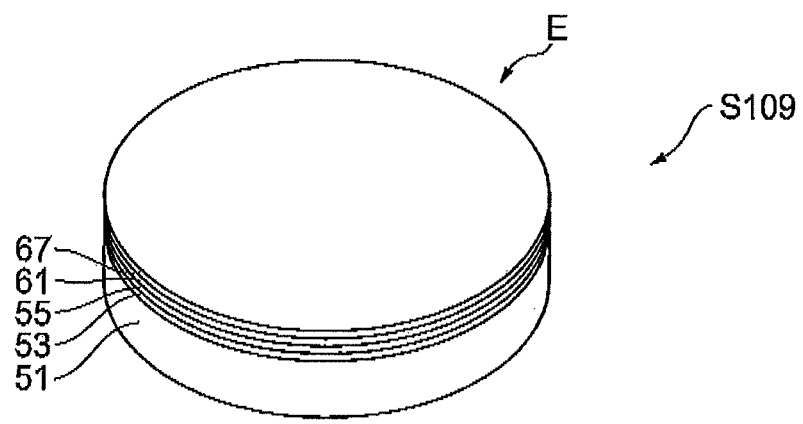
(c)

Fig.9
(a)
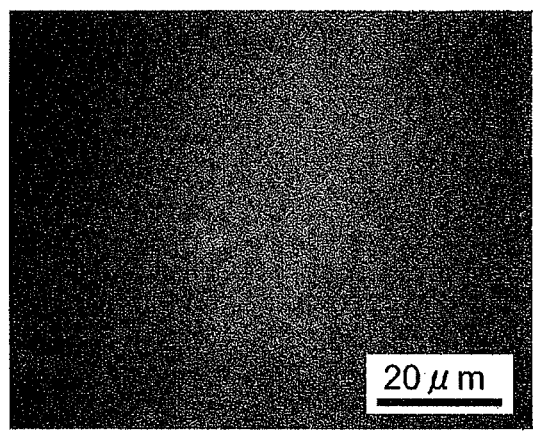
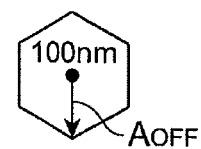
(b)
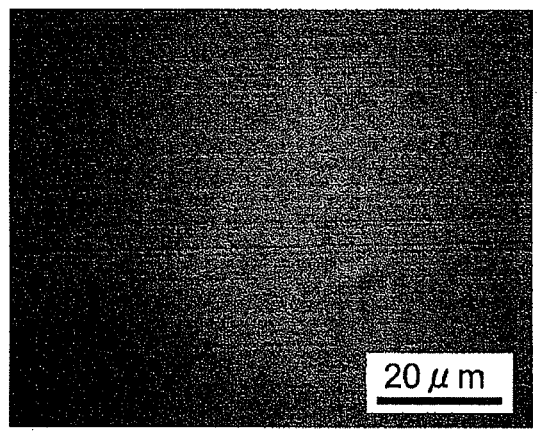
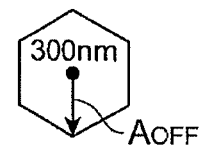
(c)
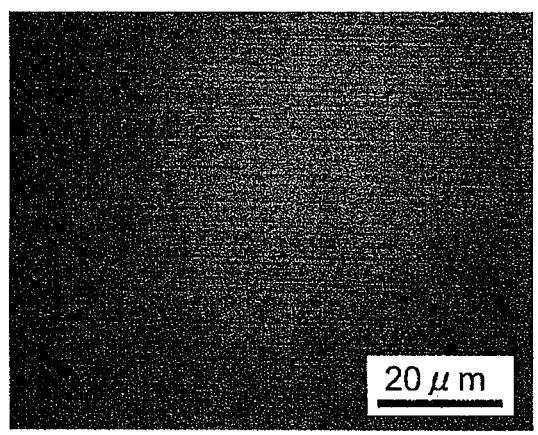
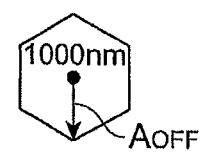

Fig.14
(a)
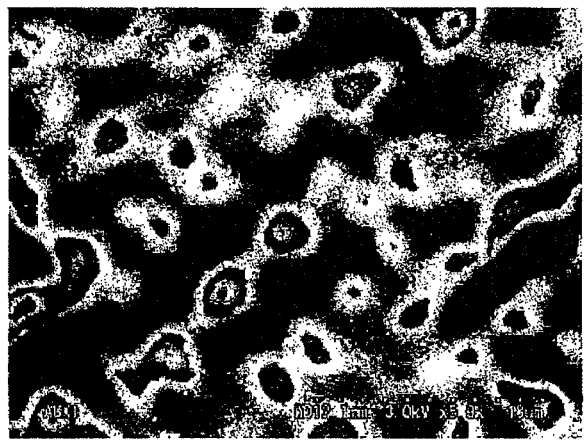
(b)
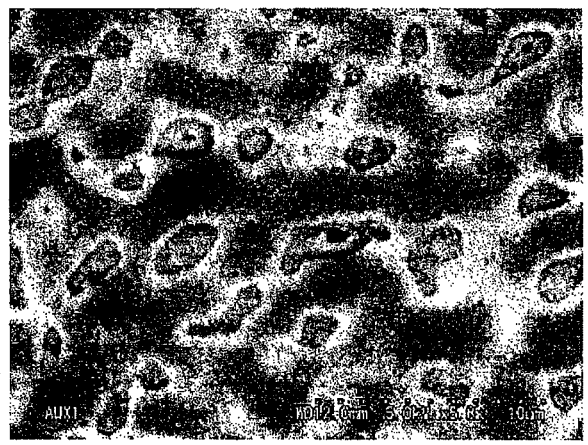
(c)
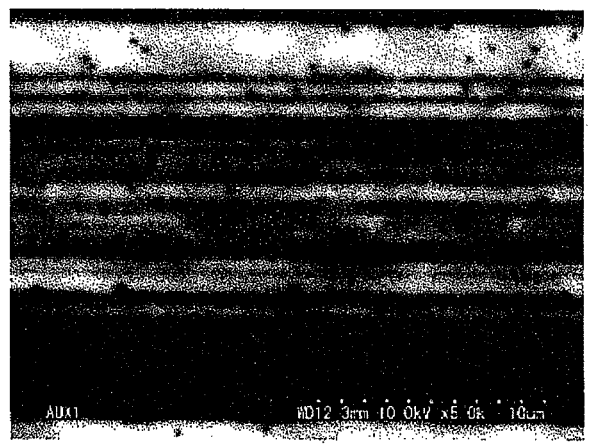

Fig.15
(a)
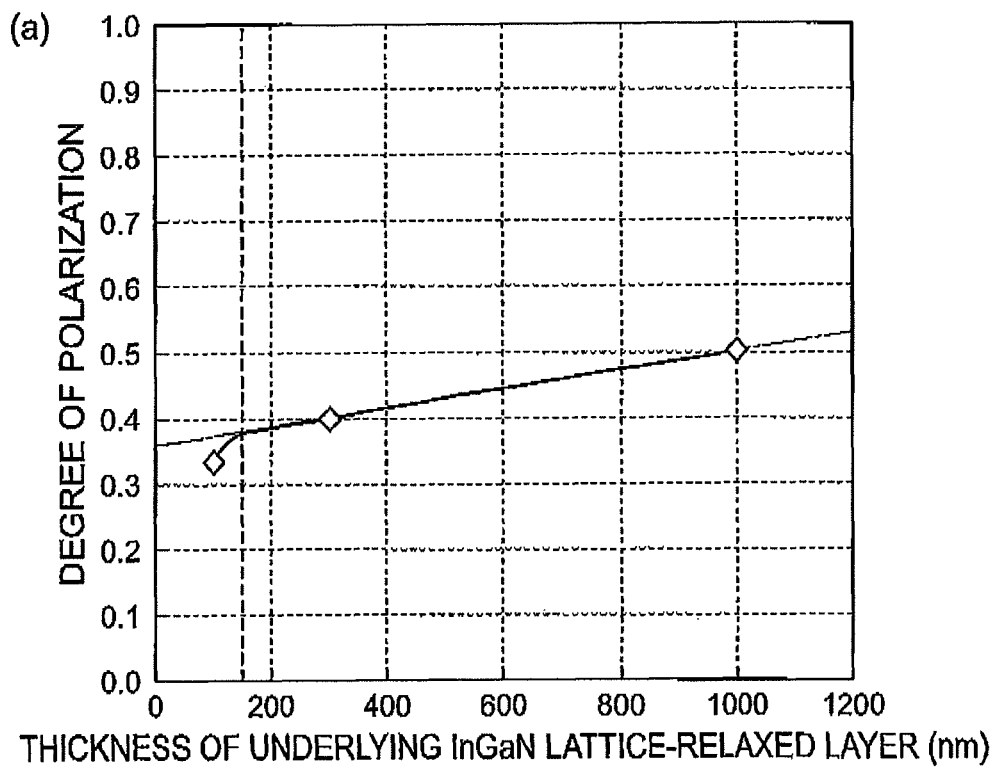
(b)
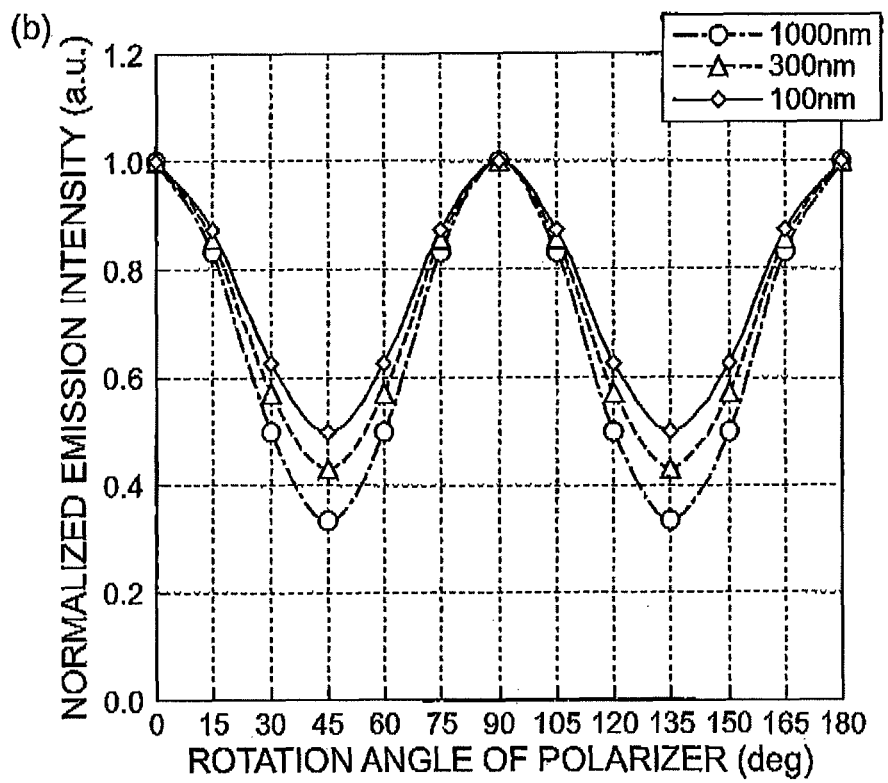

*Fig.21*
(a)
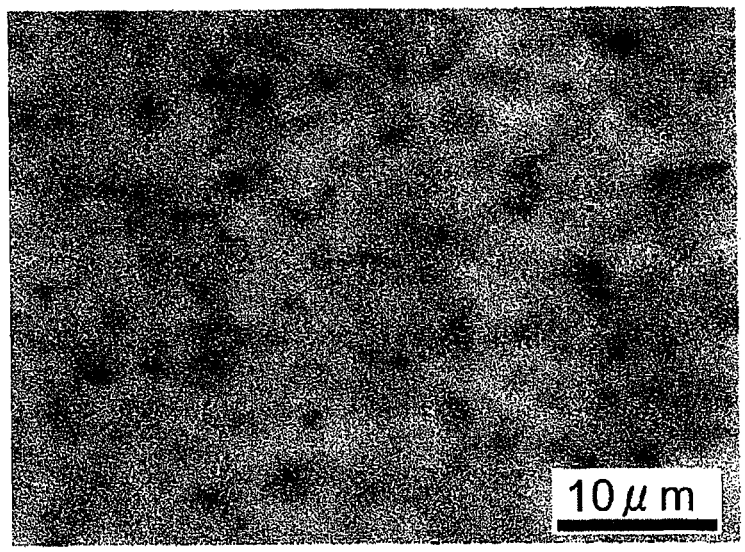
(b)
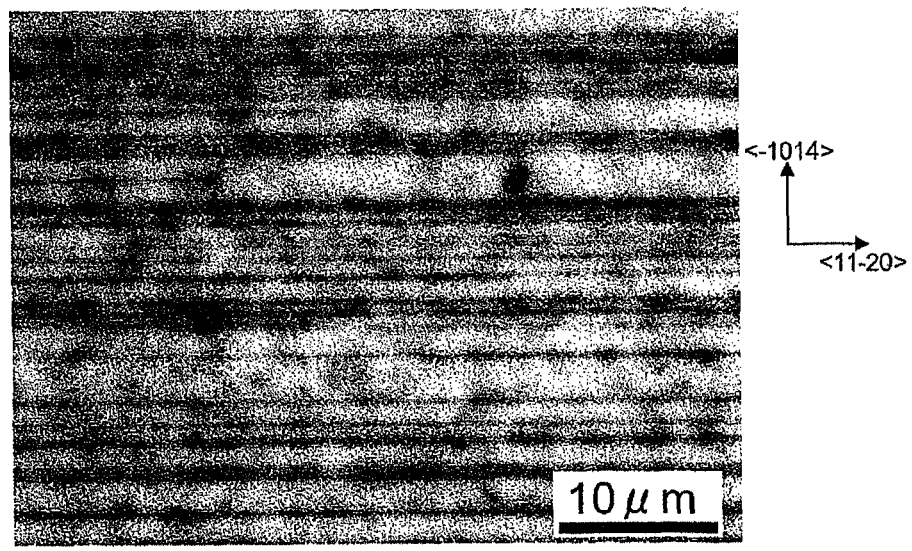

GALLIUM NITRIDE BASED SEMICONDUCTOR LIGHT-EMITTING DEVICE AND METHOD FOR FABRICATING THE SAME, GALLIUM NITRIDE BASED LIGHT-EMITTING DIODE, EPITAXIAL WAFER, AND METHOD FOR FABRICATING GALLIUM NITRIDE LIGHT-EMITTING DIODE

CROSS REFERENCE TO RELATED APPLICATIONS

This is a continuation of a application PCT application No. PCT/JP2009/067410 filed on Oct. 6, 2009, claiming the benefit of priorities from Japanese Patent application No. 2008-260823 filed on Oct. 7, 2008 and Japanese Patent application No. 2009-165982 filed on Jul. 14, 2009, and incorporated by reference in their entirety.

TECHNICAL FIELD

The present invention relates to a gallium nitride based semiconductor light-emitting device, a method for fabricating a gallium nitride based semiconductor light-emitting device, a gallium nitride based light-emitting diode, an epitaxial wafer, and a method for fabricating a gallium nitride based light-emitting diode.

BACKGROUND ART

Patent Literature 1 describes a gallium nitride based semiconductor light-emitting device provided on a GaN substrate having a nonpolar plane. It describes a number of planes for the primary surface of the GaN substrate as follows. The primary surface of the GaN substrate is: a {11-20} plane, a {1-100} plane, or, a plane inclined in the range of −5 degrees to +5 degrees from the {11-20} plane or the {1-100} plane. Furthermore, the primary surface of the GaN substrate has a plane that is inclined at an off angle θ (where 0°≤θ≤10°) with respect to either the {11-20} plane or the {1-100} plane. Furthermore, the primary surface of the GaN substrate has a {11-20} plane, a plane inclined in the range of −5 degrees to +5 degrees from the {11-20} plane, or a plane that is inclined at an off angle θ of not more than 10 degrees with respect to the {11-20} plane.

CITATION LIST

Patent Literature

Patent Literature 1: Japanese Patent Application Laid-open No. H10-135576

SUMMARY OF INVENTION

Technical Problem

In a gallium nitride based light-emitting diode, polarization of light emitted therefrom is associated with anisotropy of strain. Accordingly, in order to fabricate a light-emitting diode having a large degree of polarization, it is necessary to increase the anisotropy of strain. According to Inventors' knowledge, when an active layer is coherently grown on a semipolar primary surface of a GaN substrate, the degree of polarization is virtually determined by the off angle. For this reason, it is not easy to vary the anisotropy of strain. Inventors' investigation shows that the anisotropy of strain is increased by inducing anisotropic lattice relaxation. The inventors conduct research on the basis of this investigation and discover a structure which enables the anisotropic lattice relaxation.

In gallium nitride based laser diodes, an inter-band transition to enable lasing changes depending upon strain of the active layer thereof. The inter-band transition is associated with the lasing threshold. The gallium nitride based laser diode is required to reduce the threshold current density. According to Inventors' knowledge, the degree of polarization in the LED mode (emission before lasing) of the gallium nitride based laser diode is related to the magnitude of threshold current density of the laser diode. In the LED mode, other inter-band transitions as well as the above inter-band transition to enable lasing also emit photons. The degree of polarization of the emission in the LED mode is defined by mixture of photons from the various inter-band transitions.

The present invention has been accomplished in view of the above-described circumstances, and it is an object of the present invention to provide a gallium nitride based semiconductor light-emitting device with a structure capable of enhancing the degree of polarization; it is another object of the present invention to provide an epitaxial wafer for this gallium nitride based semiconductor light-emitting device; and it is a further object of the present invention to provide a method for fabricating the gallium nitride based semiconductor light-emitting device. The present invention has been accomplished in view of the above-described circumstances, and it is an object of the present invention to provide a gallium nitride based light-emitting diode with a structure capable of enhancing the degree of polarization; it is another object of the present invention to provide an epitaxial wafer for this gallium nitride based light-emitting diode; and it is a further object of the present invention to provide a method for fabricating the gallium nitride based light-emitting diode.

Solution to Problem

A gallium nitride based semiconductor light-emitting device according to one aspect of the present invention comprises: (a) a semiconductor region of a gallium nitride based semiconductor; (b) an InGaN layer provided directly on the primary surface of the semiconductor region; (c) an active layer comprising a well layer of InGaN, and provided on a primary surface of the InGaN layer; and (d) a support base comprising a hexagonal gallium nitride and having a primary surface inclined at an angle of not less than 10 degrees and not more than 80 degrees with respect to a plane perpendicular to a reference axis which extends in a direction of a [0001] axis of the gallium nitride. The InGaN layer is provided between the active layer and the semiconductor region; and the primary surface of the semiconductor region is inclined to have semipolar nature and is inclined with respect to a plane perpendicular to an axis which extends in a direction of a [0001] axis in the primary surface thereof. The semiconductor region comprises one or more gallium nitride based semiconductor layers; and each gallium nitride based semiconductor layer comprises one of GaN, AlGaN, InGaN and InAlGaN. A material of the primary surface of the semiconductor region is different from that of the InGaN layer; a thickness of the semiconductor region is larger than a thickness of the InGaN layer; and the thickness of the InGaN layer is not less than 100 nm. The semiconductor region is provided on the primary surface of the support base. The InGaN layer has a first InGaN lattice constant in a first direction perpendicular to the reference axis and a second InGaN lattice constant in a second direction perpendicular to the reference axis; and the first direction is perpendicular to the second direction. The support base has a first GaN lattice constant in a first direction perpendicular to the reference axis thereof and a second GaN lattice constant in a second direction perpendicular to the reference axis thereof; the first InGaN lattice constant is equal to the first GaN lattice constant; and the second InGaN lattice constant is different from the second GaN lattice constant.

In this gallium nitride based semiconductor light-emitting device, since the InGaN layer with the thickness of not less than 100 nm is formed on the semiconductor region, anisotropic lattice relaxation occurs in the InGaN layer and this InGaN layer includes anisotropic strain. Hence, the anisotropy of strain increases in the active layer on the primary surface of the InGaN layer. In the gallium nitride based semiconductor laser, it becomes feasible to enhance the degree of polarization of emission in the LED mode and, as a result of this, it becomes feasible to permit lasing by use of a transition enabling a low threshold. Furthermore, it becomes feasible to enhance the degree of polarization of a gallium nitride based light-emitting diode.

In the gallium nitride based semiconductor light-emitting device according to the present invention, the InGaN layer can have the thickness of not less than 150 nm. In this gallium nitride based semiconductor light-emitting device, it is feasible to enhance the anisotropy of strain in this InGaN layer.

In the gallium nitride based semiconductor light-emitting device according to the present invention, the InGaN layer is an optical guiding layer, and the gallium nitride based semiconductor light-emitting device can further comprise another optical guiding layer, provided on a primary surface of the active layer, which includes another InGaN layer. The gallium nitride based semiconductor light-emitting device comprises a gallium nitride based semiconductor laser, and it becomes feasible to enhance the degree of polarization of the emission in the LED mode by virtue of the anisotropic strain of the optical guiding layer. As a result, it becomes feasible to implement lasing by use of a transition of a low threshold.

In the gallium nitride based semiconductor light-emitting device according to the present invention, a degree of polarization in emission from the light-emitting layer is larger than zero. This gallium nitride based semiconductor light-emitting device can provide the degree of polarization of a nonnegative value.

In the gallium nitride based semiconductor light-emitting device according to the present invention, the primary surface of the semiconductor region comprises GaN. In the gallium nitride based semiconductor light-emitting device according to the present invention, the angle of the inclination is not less than 63 degrees and not more than 80 degrees. In this gallium nitride based semiconductor light-emitting device, it is feasible to reduce In segregation in the InGaN layer and thus to reduce stress distribution caused by the In segregation.

In the gallium nitride based semiconductor light-emitting device according to the present invention, the gallium nitride based semiconductor light-emitting device may be configured to include a semiconductor laser, and an optical waveguide in the semiconductor laser extends in the inclination direction of the c-axis thereof. In this gallium nitride based semiconductor light-emitting device, it is feasible to provide an optical cavity that enables lasing of a low threshold.

In the gallium nitride based semiconductor light-emitting device according to the present invention, misfit dislocations are generated at an interface between the semiconductor region and the InGaN layer to induce lattice relaxation in the InGaN layer. In the gallium nitride based semiconductor light-emitting device, strain of the active layer is changed by the lattice relaxation of the InGaN layer.

In the gallium nitride based semiconductor light-emitting device according to the present invention, the misfit dislocations induce anisotropic lattice relaxation in the InGaN layer, lattice relaxation occurs in a direction to which the reference axis is inclined, and no lattice relaxation occurs in a direction perpendicular to the aforementioned direction and the reference axis. In the gallium nitride based semiconductor light-emitting device, the active layer incorporates anisotropic strain by virtue of the anisotropic lattice relaxation of the InGaN layer.

A gallium nitride based light-emitting diode and a gallium nitride based semiconductor light-emitting device according to one aspect of the present invention comprise: (a) a semiconductor region having a primary surface of a gallium nitride based semiconductor; (b) an InGaN layer provided directly on the primary surface of the semiconductor region; and (c) an active layer comprising a well layer of InGaN and provided on a primary surface of the InGaN layer. The InGaN layer is provided between the active layer and the semiconductor region; the primary surface of the semiconductor region is inclined with respect to a plane perpendicular to a reference axis, which extends along the [0001] axis direction in the primary surface, to have semipolar nature; the semiconductor region comprises one or more gallium nitride based semiconductor layers; each gallium nitride based semiconductor layer comprises GaN or AlGaN, a thickness of the semiconductor region is larger than a thickness of the InGaN layer; and the InGaN layer has the thickness of not less than 150 nm.

In the gallium nitride based light-emitting diode and gallium nitride based semiconductor light-emitting device, since the InGaN layer with the thickness of not less than 150 nm is formed on the semiconductor region comprising GaN or AlGaN, anisotropic lattice relaxation is caused in the InGaN layer, and this InGaN layer includes anisotropic strain. Accordingly, the anisotropy of strain increases in the active layer on the primary surface of the InGaN layer. Hence, it becomes feasible to enhance the degree of polarization of the gallium nitride based light-emitting diode.

In the gallium nitride based light-emitting diode and gallium nitride based semiconductor light-emitting device according to the present invention, the primary surface of the semiconductor region can comprise GaN, and an angle of the inclination can be not less than 10 degrees and not more than 80 degrees.

In the gallium nitride based light-emitting diode and gallium nitride based semiconductor light-emitting device, since a c-plane is inclined in the foregoing angle range from the primary surface, misfit dislocations are generated with the c-plane acting as a slip plane, thereby inducing lattice relaxation in the InGaN layer.

The gallium nitride based light-emitting diode and gallium nitride based semiconductor light-emitting device according to the present invention can further comprise a support base comprising a hexagonal gallium nitride and having a primary surface inclined with respect to a plane perpendicular to the reference axis that extends in a direction of the [0001] axis of the gallium nitride. The InGaN layer has a first InGaN lattice constant in a first direction perpendicular to the reference axis and a second InGaN lattice constant in a second direction perpendicular to the reference axis; the first direction is perpendicular to the second direction. The support base has a first GaN lattice constant in the first direction perpendicular to the reference axis and a second GaN lattice constant in the second direction perpendicular to the reference axis. The first InGaN lattice constant is equal to the first GaN lattice constant, and the second InGaN lattice constant is different from the second GaN lattice constant.

In the gallium nitride based light-emitting diode and gallium nitride based semiconductor light-emitting device, desired anisotropic lattice relaxation is as follows: no lattice relaxation occurs in one of two directions perpendicular to each other; and the lattice relaxation occurs in the other direction. More specifically, lattice relaxation occurs in the first direction to which the reference axis along the [0001] axis direction is inclined from the primary surface of the substrate, and no lattice relaxation occurs in the second direction perpendicular to the reference axis and the first direction.

In the gallium nitride based light-emitting diode and gallium nitride based semiconductor light-emitting device according to the present invention, the reference axis can be inclined in a direction in the range of not less than −15 degrees and not more than +15 degrees with respect to the <1-100> direction of the gallium nitride of the support base. In the gallium nitride based light-emitting diode and gallium nitride based semiconductor light-emitting device, major lattice relaxation occurs in the <1-100> direction. In the gallium nitride based light-emitting diode and gallium nitride based semiconductor light-emitting device according to the present invention, the reference axis can be inclined in a direction in the range of not less than −15 degrees and not more than +15 degrees with respect to the <11-20> direction of the gallium nitride of the support base. In the gallium nitride based light-emitting diode and gallium nitride based semiconductor light-emitting device, major lattice relaxation occurs in the <11-20> direction.

In the gallium nitride based light-emitting diode and gallium nitride based semiconductor light-emitting device according to the present invention, an indium composition of the InGaN layer is smaller than an indium composition of the well layer. Furthermore, in the gallium nitride based light-emitting diode and gallium nitride based semiconductor light-emitting device according to the present invention, the indium composition of the InGaN layer is preferably not less than 0.02. An indium composition which is too small is not be effective in generation of anisotropic lattice relaxation. The indium composition of the InGaN layer is preferably not more than 0.10. An indium composition which is too large degrades the crystal quality of the InGaN layer.

The gallium nitride based light-emitting diode and gallium nitride based semiconductor light-emitting device according to the present invention can further comprise a support base which comprises a hexagonal gallium nitride and has a primary surface inclined with respect to a plane perpendicular to a reference axis along the [0001] axis direction of the gallium nitride. The semiconductor region is mounted on the primary surface of the support base, and misfit dislocations are generated at an interface between the semiconductor region and the InGaN layer to induce lattice relaxation in the InGaN layer.

In the gallium nitride based light-emitting diode and gallium nitride based semiconductor light-emitting device, since the semiconductor region and the InGaN layer are provided on the support base that comprises the gallium nitride, the crystal quality of the semiconductor region is made excellent. The InGaN layer incorporating anisotropic strain can be formed on this semiconductor region. Therefore, it is feasible to prevent the anisotropic lattice relaxation in the InGaN layer from being reduced because of defects or the like of the underlying crystal.

In the gallium nitride based light-emitting diode and gallium nitride based semiconductor light-emitting device according to the present invention, the InGaN layer incorporates anisotropic lattice relaxation due to the misfit dislocations. In the gallium nitride based light-emitting diode and gallium nitride based semiconductor light-emitting device, lattice relaxation occurs in a direction to which the reference axis is inclined and no lattice relaxation occurs in a direction perpendicular to the foregoing direction and the reference axis.

In the gallium nitride based light-emitting diode and gallium nitride based semiconductor light-emitting device according to the present invention, the density of threading dislocations in the support base can be not more than $1 \times 10^7$ $cm^{-2}$ in a c-plane. This support base can provide a low-defect semiconductor layer. Furthermore, in the gallium nitride based light-emitting diode and gallium nitride based semiconductor light-emitting device according to the present invention, the thickness of the InGaN layer can be not less than 300 nm. Furthermore, in the gallium nitride based light-emitting diode according to the present invention, the thickness of the InGaN layer can be not less than 1000 nm.

Another aspect of the present invention is an epitaxial wafer for a gallium nitride based light-emitting diode and a gallium nitride based semiconductor light-emitting device. This epitaxial wafer comprises: (a) a substrate comprising a hexagonal gallium nitride and having a primary surface inclined with respect to a plane perpendicular to a reference axis which extends in a direction of a [0001] axis of the gallium nitride; (b) a semiconductor region comprising one or more gallium nitride based semiconductor layers; (c) an InGaN layer provided directly on a primary surface of the semiconductor region; (d) an active layer comprising a well layer of InGaN and provided above the primary surface of the support base; and (e) a support base comprising a hexagonal gallium nitride and having a primary surface inclined at an angle of not less than 10 degrees and not more than 80 degrees with respect to a plane perpendicular to a reference axis which extends in a direction of a [0001] axis of the gallium nitride. The InGaN layer is provided between the active layer and the semiconductor region. The primary surface of the semiconductor region is inclined to have semipolar nature and is inclined with respect to a plane perpendicular to a reference axis which extends in a direction of a [0001] axis in the primary surface. The semiconductor region comprises one or more gallium nitride based semiconductor layers, and each gallium nitride based semiconductor layer comprises one of GaN, AlGaN, InGaN and InAlGaN. A material of the primary surface of the semiconductor region is different from that of the InGaN layer. A thickness of the semiconductor region is larger than a thickness of the InGaN layer. The InGaN layer has a thickness of not less than 100 nm. The semiconductor region is provided on the primary surface of the substrate. The InGaN layer has a first InGaN lattice constant in a first direction perpendicular to the reference axis and a second InGaN lattice constant in a second direction perpendicular to the reference axis. The first direction is perpendicular to the second direction. The substrate has a first GaN lattice constant in a first direction the reference axis thereof and a second GaN lattice constant in a second direction perpendicular to the reference axis thereof. The first InGaN lattice constant is equal to the first GaN lattice constant, and the second InGaN lattice constant is different from the second GaN lattice constant.

Another aspect of the present invention is an epitaxial wafer for a gallium nitride based light-emitting diode and a gallium nitride based semiconductor light-emitting device. This epitaxial wafer comprises: (a) a substrate comprising a hexagonal gallium nitride and having a primary surface inclined with respect to a plane perpendicular to a reference axis which extends in a direction of a [0001] axis of the gallium nitride; (b) a semiconductor region comprising one or more gallium nitride based semiconductor layers; (c) an InGaN layer provided directly on a primary surface of the semiconductor region; and (d) an active layer comprising a well layer of InGaN and provided on the primary surface of the support base. The semiconductor region is provided between the support base and the InGaN layer; the InGaN layer is provided between the active layer and the semiconductor region; each gallium nitride based semiconductor layer comprises GaN or AlGaN. A thickness of the semiconductor region is larger than a thickness of the InGaN layer; and the thickness of the InGaN layer is not less than 150 nm.

In this epitaxial wafer, since the thickness of the semiconductor region comprising GaN or AlGaN is larger than the thickness of the InGaN layer, and the thickness of the InGaN layer is not less than 150 nm. The InGaN layer includes strain, whereas anisotropic lattice relaxation occurs in this InGaN layer. Accordingly, anisotropy of strain is increased in the active layer on the primary surface of the InGaN layer. Hence, the epitaxial wafer is provided with the active layer including the anisotropic strain.

Still another aspect of the present invention is a method for fabricating gallium nitride based semiconductor light-emitting device. The method comprises the steps of: (a) preparing a substrate, the substrate comprising a hexagonal gallium nitride and having a primary surface inclined at an angle of not less than 10 degrees and not more than 80 degrees with respect to a plane perpendicular to a reference axis which extends in a direction of a [0001] axis of the gallium nitride; (b) growing a semiconductor region, which comprises a gallium nitride based semiconductor and has a primary surface of semipolar nature, on the substrate; (c) growing an InGaN layer, which has a thickness of not less than 100 nm and includes anisotropic lattice relaxation, directly on the primary surface of the semiconductor region; and (d) growing an active layer on a primary surface of the InGaN layer. The active layer comprises a well layer of InGaN. The primary surface of the semiconductor region is inclined with respect to a plane perpendicular to an axis which extends in a direction of a [0001] axis in the primary surface. The semiconductor region comprises one of GaN, AlGaN, InGaN and InAlGaN. A material of the primary surface of the semiconductor region is different from the InGaN layer. The InGaN layer has a first InGaN lattice constant in a first direction perpendicular to the reference axis and a second InGaN lattice constant in a second direction perpendicular to the reference axis. The first direction is perpendicular to the second direction. The substrate has a first GaN lattice constant in a first direction perpendicular to the reference axis thereof and a second GaN lattice constant in a second direction perpendicular to the reference axis thereof. The first InGaN lattice constant is equal to the first GaN lattice constant. The second InGaN lattice constant is different from the second GaN lattice constant, and a thickness of the semiconductor region is larger than a thickness of the InGaN layer.

Still another aspect of the present invention is a method for fabricating a gallium nitride based light-emitting diode and a gallium nitride based semiconductor light-emitting device. This method comprises the steps of: (a) growing an InGaN layer, which has a thickness of not less than 150 nm, directly on a semipolar primary surface of a semiconductor region which comprises a gallium nitride based semiconductor; and (b) growing an active layer on a primary surface of the InGaN layer. The InGaN layer includes anisotropic lattice relaxation; the active layer comprises a well layer of InGaN; the primary surface of the semiconductor region is inclined with respect to a plane perpendicular to a reference axis extending along the [0001] axis direction in the primary surface; the semiconductor region comprises GaN or AlGaN; and a thickness of the semiconductor region is larger than a thickness of the InGaN layer.

In this method, the difference between the lattice constant of the semiconductor region and the lattice constant of the InGaN layer is large. When the InGaN layer with the thickness of not less than 150 nm is grown on the semiconductor region, misfit dislocations are generated at the interface between the InGaN layer and the semiconductor region. The misfit dislocations form anisotropic lattice relaxation in accordance with the inclination direction of the primary surface of the semiconductor region, in the InGaN layer.

In the method according to the present invention, the primary surface of the InGaN layer can have a streaky morphology extending in the direction that intersects with an inclination direction of the reference axis. According to this method, the foregoing morphology is associated with a slip plane of misfit dislocations.

The above objects and other objects, features, and advantages of the present invention will more readily become clear from the following detailed description of preferred embodiments of the present invention proceeding with reference to the accompanying drawings.

Advantageous Effects of Invention

As described above, one aspect of the present invention provides the gallium nitride based semiconductor light-emitting device with the structure capable of enhancing the degree of polarization. Another aspect of the present invention provides the epitaxial wafer for this gallium nitride based semiconductor light-emitting device. Furthermore, still another aspect of the present invention provides the method for fabricating the gallium nitride based semiconductor light-emitting device. One aspect of the present invention provides the gallium nitride based light-emitting diode with the structure capable of enhancing the degree of polarization. Another aspect of the present invention provides the epitaxial wafer for this gallium nitride based light-emitting diode. Furthermore, still another aspect of the present invention provides the method for fabricating the gallium nitride based light-emitting diode.

BRIEF DESCRIPTION OF DRAWINGS

FIG. 5 is a drawing to explain strain of unrelaxed InGaN and relaxed InGaN provided on a semipolar plane.

FIG. 6 is a drawing showing major steps in a method for fabricating a gallium nitride based light-emitting diode and a method for fabricating an epitaxial wafer.

FIG. 8 is a drawing showing major steps in the method for fabricating the gallium nitride based light-emitting diode and the method for fabricating the epitaxial wafer.

FIG. 9 is a drawing showing differential interference microscope images of surfaces of epitaxial wafers observed at a relatively high magnification of 1000.

FIG. 14 is a drawing showing CL images at acceleration voltages of 3 kV, 5 kV and 10 kV.

FIG. 15 is a drawing showing a relation between thickness of underlying InGaN lattice-relaxed layer and degree of polarization in the thickness range of not less than 150 nm, and a dependence property of rotation angle of a polarizer versus emission intensity.

FIG. 21 shows a CL image at the acceleration voltage of 15 kV and a CL image at the acceleration voltage of 20 kV.

DESCRIPTION OF EMBODIMENTS

The expertise of the present invention can be readily understood in view of the following detailed description with reference to the accompanying drawings presented by way of illustration. Embodiments of the gallium nitride based light-emitting diode, the gallium nitride based semiconductor light-emitting device, the epitaxial wafer for these devices, and the methods for fabricating the epitaxial wafer, the gallium nitride based semiconductor light-emitting device, and the gallium nitride based light-emitting diode according to the present invention will be described below with reference to the accompanying drawings. The same portions will be denoted by the same reference signs, as much as possible. In the description hereinafter, for example, a crystal axis opposite to the <0001> axis will be represented by <000-1>.

Figure 1:
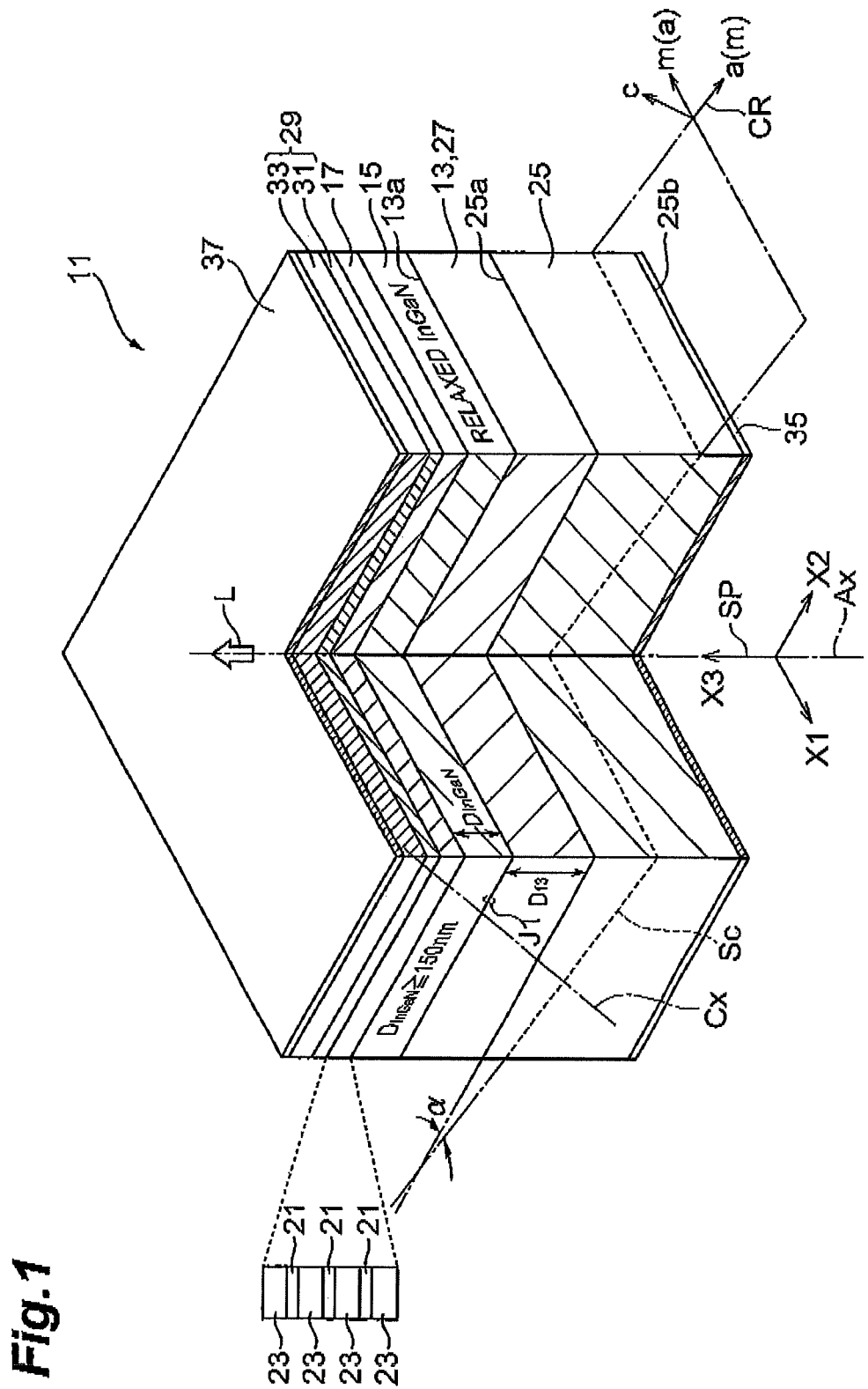
FIG. 1 is a drawing showing a structure of a gallium nitride based light-emitting diode according to an embodiment of the present invention.
Figure 2:
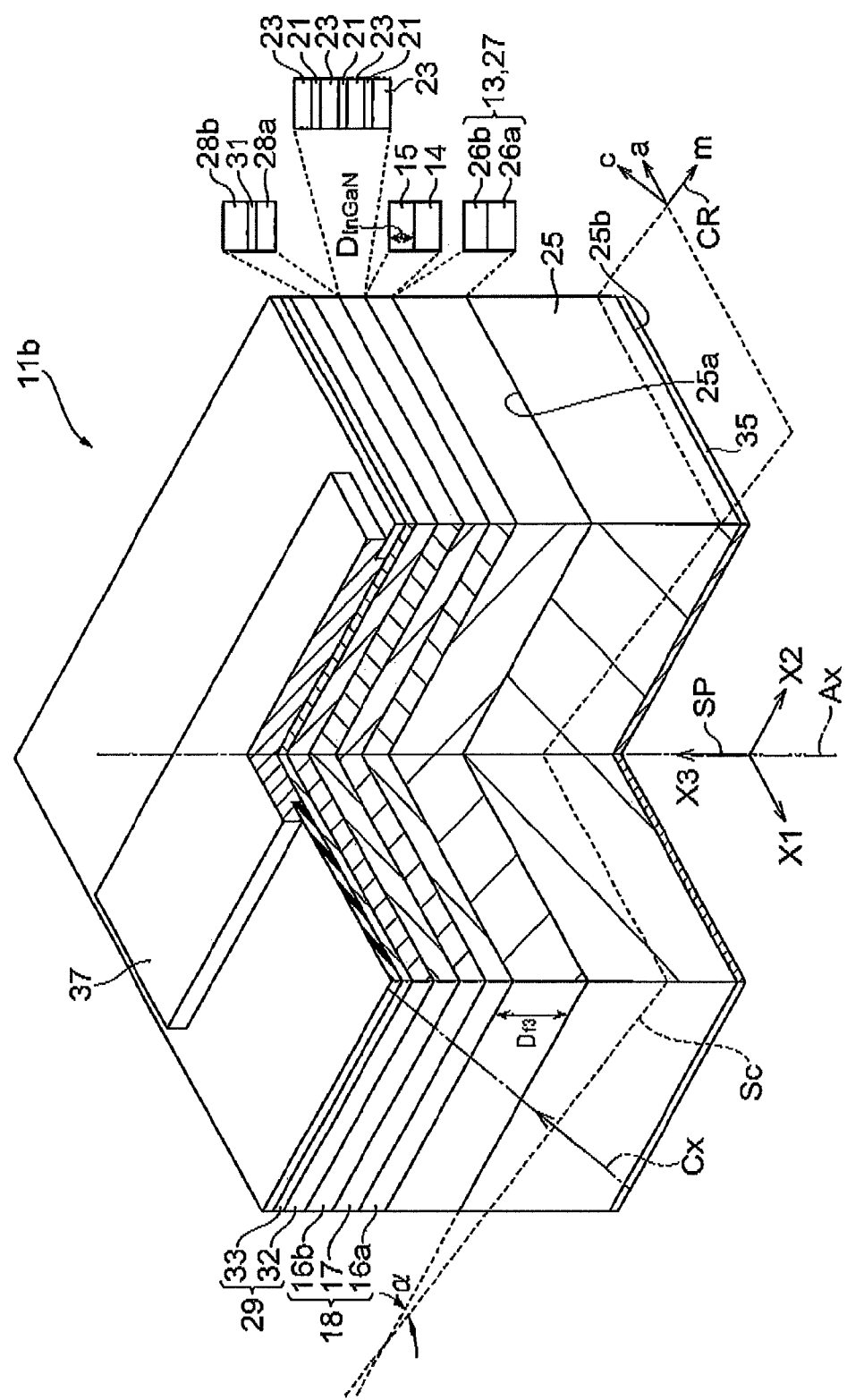
FIG. 2 is a drawing showing a structure of a gallium nitride based semiconductor light-emitting device according to an embodiment of the present invention.

FIG. 1 is a drawing showing a structure of a gallium nitride based light-emitting diode according to an embodiment of the present invention. FIG. 2 is a drawing showing a structure of a gallium nitride based semiconductor light-emitting device according to an embodiment of the present invention. In FIGS. 1 and 2, a c-plane Sc is illustrated, and a crystal coordinate system CR representing the c-axis, a-axis and m-axis and a coordinate system SP representing X1-axis, X2-axis and X3-axis are shown. The X3-axis is a lamination direction of semiconductor layers, and this direction is different from the direction of the c-axis. The gallium nitride based light-emitting diode is a surface emitting device that emits light L in the positive direction or in the negative direction of the X3-axis. Examples of gallium nitride based semiconductor light-emitting devices include a gallium nitride based light-emitting diode (which will be referred to hereinafter simply as "light-emitting diode") 11a and a gallium nitride based laser diode (which will be referred to hereinafter simply as "laser diode") 11b.

The light-emitting diode 11a and the laser diode 11b are provided with a gallium nitride based semiconductor region (which will be referred to hereinafter simply as "semiconductor region") 13, an InGaN layer 15 and an active layer 17. The semiconductor region 13 has a primary surface 13a which exhibits semipolar nature. The semiconductor region 13 comprises one or plural gallium nitride based semiconductor layers, and each gallium nitride based semiconductor layer comprises GaN or AlGaN. The InGaN layer 15 is provided between the active layer 17 and the semiconductor region 13. The primary surface 13a of the semiconductor region 13 is inclined at an angle a with respect to a plane (e.g., Sc) perpendicular to the reference axis Cx that extends in a direction of the [0001] axis in the primary surface 13a. The InGaN layer 15 has the thickness $D_{InGaN}$ of not less than 150 nm. The InGaN layer 15 is provided directly on the primary surface 13a of the semiconductor region 13 so as to be in contact with the primary surface 13a. The active layer 17 is provided on a primary surface 15a of the InGaN layer 15 so as to be in contact with this primary surface 15a. The active layer 17 includes well layers 21 comprising InGaN. Since the thickness $D_{13}$ of the semiconductor region 13 is larger than the thickness $D_{InGaN}$ of the InGaN layer 17, stress is applied by the semiconductor region 13 to the InGaN layer 17.

In the light-emitting diode 11a and laser diode 11b, when the InGaN layer 15 with the thickness $D_{InGaN}$ of not less than 150 nm is provided on the semiconductor region 13 of GaN or AlGaN, anisotropic lattice relaxation occurs in the InGaN layer 15, whereby the InGaN layer 15 incorporates strain. Furthermore, when the InGaN layer 15 with the thickness $D_{InGaN}$ of not less than 150 nm is provided on the semiconductor region 13 of InGaN or InAlGaN, anisotropic lattice relaxation occurs in the InGaN layer 15, whereby the InGaN layer 15 incorporates strain. Directions of this anisotropic lattice relaxation are associated with the inclination direction of the primary surface 13a. For this reason, anisotropy of strain increases in the active layer 17 on the primary surface 15a of the InGaN layer 15. Therefore, the degree of polarization can be increased for the light-emitting diode 11a and the laser diode 11b. Furthermore, the thickness $D_{InGaN}$ may be not less than 100 nm. At this film thickness of the InGaN layer, the anisotropic lattice relaxation also is caused such that the InGaN layer incorporates anisotropic strain.

In the light-emitting diode 11a and the laser diode 11b, the indium composition of the InGaN layer 15 is smaller than that of the well layers 21. The active layer 17 includes plural barrier layers 23, and the well layers 21 are located between the barrier layers 23.

In the light-emitting diode 11a and the laser diode 11b, the InGaN layer 15 with the thickness $D_{InGaN}$ of not less than 150 nm is provided on the semiconductor region 13 of GaN or AlGaN, whereby anisotropic lattice relaxation is caused in the InGaN layer 15 such that the InGaN layer 15 incorporates strain. Directions of this anisotropic lattice relaxation are associated with the inclination direction of the primary surface 13a. For this reason, the anisotropy of strain increases in the active layer 17 on the primary surface 15a of the InGaN layer 15. Therefore, the degree of polarization can be increased in the LED mode of the light-emitting diode 11a and the laser diode 11b.

A support base 25 comprises a hexagonal gallium nitride. A primary surface 25a of the support base 25 is inclined with respect to the plane Sc perpendicular to the reference axis Cx that extends in the direction of the [0001] axis of the gallium nitride. The primary surface 25a exhibits semipolar nature. The support base 25 mounts the semiconductor region 13, InGaN layer 15 and active layer 17 thereon. The semiconductor region 13, InGaN layer 15, and active layer 17 are arranged on the primary surface 25a along a predetermined axis Ax.

Figure 3:
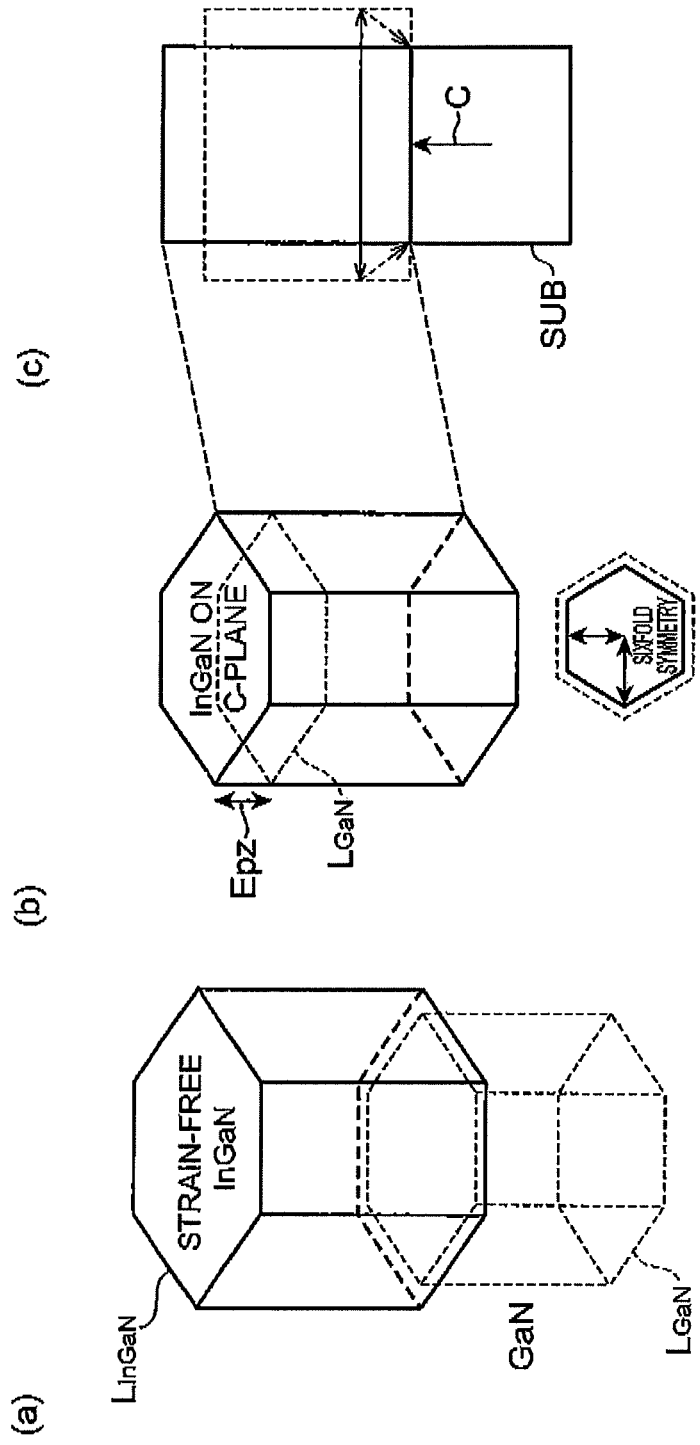
FIG. 3 is a drawing to explain strain-free InGaN, InGaN on a c-plane, and strain thereof.
Figure 4:
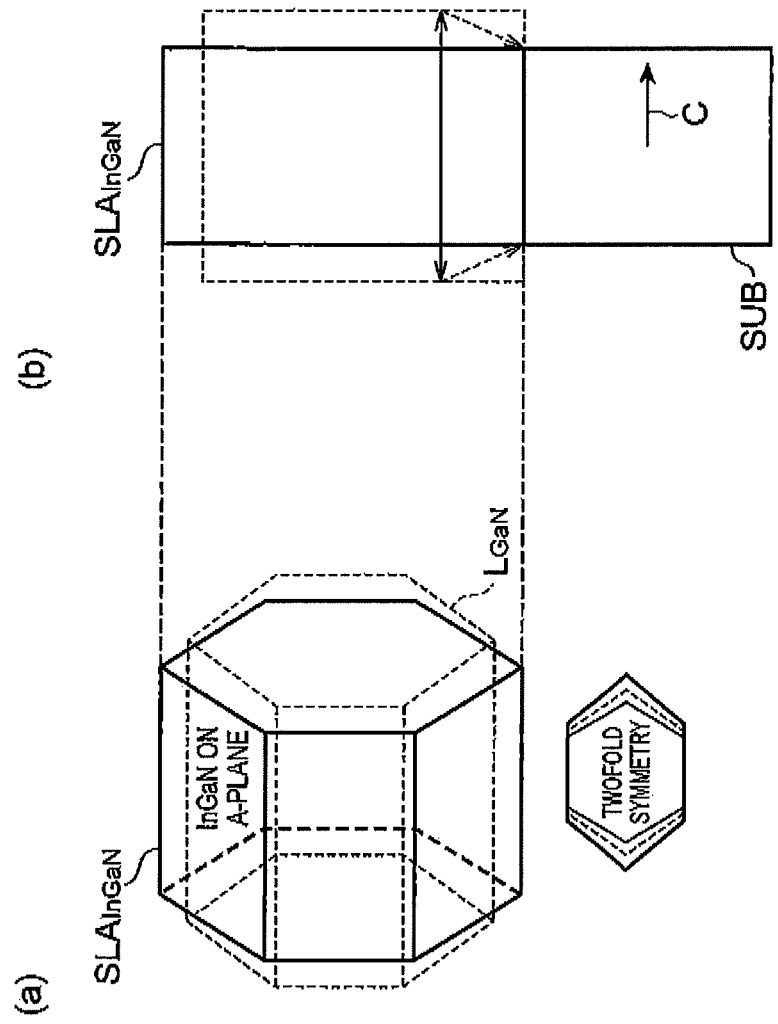
FIG. 4 is a drawing to explain strain of unrelaxed InGaN and relaxed InGaN provided on an a-plane.

The strain of the active layer will be described with reference to FIGS. 3 and 4. FIG. 3(a) shows a unit cell $L_{GaN}$ of strain-free GaN and a unit cell $L_{InGaN}$ of strain-free InGaN. The a-axis and c-axis of the unit cell $L_{InGaN}$ of InGaN are larger than those of the unit cell $L_{GaN}$ of GaN because of addition of indium atoms to GaN.

FIG. 3(b) and FIG. 3(c) show a unit cell $SL0_{InGaN}$ of hexagonal InGaN grown on a c-plane of hexagonal GaN. In the InGaN unit cell $SL0_{InGaN}$ on the c-plane GaN, the a-axis of InGaN becomes strained so as to fit the a-axis of GaN, and then InGaN deforms in accordance with the strain to extend in the c-axis direction. The change of the crystal axis in the c-axis direction causes a piezoelectric field $E_{PZ}$. This hexagonal InGaN incorporates strain, but its six-fold symmetry is maintained. Therefore, strained InGaN has an a-axis and a m-axis strained similarly so as to fit the a-axis and m-axis of GaN. For this reason, there is no significant change in anisotropy of strain. Vector C indicating the c-axis direction is shown in FIG. 3(c), and InGaN on the hexagonal GaN crystal SUB is strained so that the InGaN lattice constants (a-axis and m-axis) in directions parallel to the primary surface of the hexagonal GaN crystal SUB fit the GaN lattice constants (a-axis and m-axis) in the directions parallel to the primary surface of the hexagonal GaN crystal SUB.

FIG. 4(a) and FIG. 4(b) show a unit cell $SLA_{InGaN}$ of hexagonal InGaN grown on an a-plane of hexagonal GaN. In the InGaN unit cell $SLA_{InGaN}$ on the a-plane GaN, the c-axis and m-axis of InGaN become strained so as to fit the c-axis and m-axis, respectively, of GaN, and in accordance with this strain, InGaN deforms in the a-axis direction. This hexagonal InGaN includes compressive strain in the c-axis and the m-axis and tensile strain in the direction of the a-axis. This strained InGaN has two-fold symmetry with respect to the c-axis. An InGaN unit cell on an m-plane also has two-fold symmetry as that on the a-plane does. Vector C indicating the c-axis direction is shown in FIG. 4(b), and InGaN on the hexagonal GaN crystal SUB is strained so that the InGaN lattice constant (c-axis) in a direction parallel to the primary surface of the hexagonal GaN crystal SUB fits the GaN lattice constant (c-axis) in the direction parallel to the primary surface of the hexagonal GaN crystal SUB.

FIG. 5(a) and FIG. 5(c) show a unit cell $SLS_{InGaN}$ of hexagonal InGaN grown on a semipolar plane of hexagonal GaN inclined toward the a-axis direction. The InGaN unit cell $SLS_{InGaN}$ on the GaN semipolar plane inclined to the a-axis is strained so that the lattice constants of InGaN in directions perpendicular to a growth direction fit the lattice constants of GaN in the directions perpendicular to the growth direction. This hexagonal InGaN includes strain in the directions of the c-axis, m-axis and a-axis. This strained InGaN has two-fold symmetry with respect to the c-axis. The InGaN unit cell $SLS_{InGaN}$ has strain $ST_A$ in the a-axis direction and strain $ST_M$ in the m-axis direction. Referring to FIG. 5(c), a unit cell $INH_{InGaN}$ of strain-free hexagonal InGaN is shown. When InGaN is grown on a semipolar plane of the hexagonal GaN crystal SUB, the unit cell $INH_{InGaN}$ becomes deformed and is strained into the InGaN unit cell $SLS_{InGaN}$.

FIG. 5(b) and FIG. 5(d) show a unit cell $LS_{InGaN}$ of hexagonal InGaN grown on a semipolar plane of hexagonal GaN inclined toward the a-axis direction. The InGaN unit cell $LS_{InGaN}$ on the GaN semipolar plane inclined to the a-axis is strained so that the lattice constants of InGaN in directions perpendicular to a growth direction fit the lattice constants of GaN in the directions perpendicular to the growth direction. Since the InGaN layer 15 undergoes lattice relaxation, the hexagonal InGaN incorporates strain in the directions of the c-axis and m-axis, but part or the whole of the lattice strain in the a-axis direction is released to become relaxed. This strained InGaN has two-fold symmetry with respect to the c-axis. The InGaN unit cell $LS_{InGaN}$ shown in FIG. 5(b) has strain $RT_A$ in the a-axis direction and strain $RT_M$ in the m-axis direction. Because of the action of the lattice relaxation in the InGaN layer 15, the strain ratio ($RT_M/RT_A$) in the well layers is sufficiently smaller than the strain ratio ($ST_M/ST_A$). Accordingly, the strain ratio ($RT_M/RT_A$) in the well layers becomes larger because of the lattice relaxation. Furthermore, since the strain in the c-axis direction is made smaller because of the lattice relaxation, the piezoelectric field becomes smaller. Referring to FIG. 5(d), the unit cell $INH_{InGaN}$ of strain-free hexagonal InGaN and the InGaN unit cell are illustrated. When InGaN is grown on the semipolar plane $LS_{InGaN}$ of the hexagonal GaN crystal SUB, the unit cell $INH_{InGaN}$ is deformed and is strain-relaxed as described above to change into the InGaN unit cell $LS_{InGaN}$.

In the InGaN layer shown in FIG. 5(b), the lattice relaxation in one of the two directions orthogonal to each other is greater than that in the other direction. A useful example will be described in terms of the lattice constants. In the light-emitting diode 11a and the laser diode 11b, the InGaN layer 15 has first and second InGaN lattice constants $d_{a1}$ and $d_{m1}$ in first and second directions orthogonal to each other (e.g., the a-axis and m-axis). The first and second InGaN lattice constants $d_{a1}$ and $d_{m1}$ are defined in directions orthogonal to the reference axis Cx. The support base 25 has first and second GaN lattice constants $d_{a0}$ and $d_{m0}$ in the first and second directions orthogonal to each other (e.g., the a-axis and m-axis). The second InGaN lattice constant $d_{m1}$ is equal to the second GaN lattice constant $d_{m0}$, and the first InGaN lattice constant $d_{a1}$ is different from the first GaN lattice constant $d_{a0}$. In a desired anisotropic lattice relaxation, no effective lattice relaxation occurs in one of two directions orthogonal to each other, and an effective lattice relaxation occurs in the other direction.

In the light-emitting diode 11a and the laser diode 11b, when the primary surface 13a of the semiconductor region 13 comprises, for example, GaN or AlGaN, the angle of inclination thereof can be not less than 10 degrees and not more than 80 degrees. When the primary surface 13a of the semiconductor region 13 comprises, for example, InGaN or InAlGaN, the angle of inclination thereof can be not less than 10 degrees and not more than 80 degrees, and this InGaN is different in composition from the InGaN layer 15. Furthermore, the inclination angle of the primary surface 25a of the support base 25 can be not less than 10 degrees and not more than 80 degrees. Since the c-plane is inclined in the aforementioned angle range with respect to the primary surface 13a in the light-emitting diode 11a and the laser diode 11b, misfit dislocations are formed to occur with the c-plane acting as a slip plane, thereby causing lattice relaxation in the InGaN layer 15. The density of misfit dislocations can be, for example, not less than $5 \times 10^{+2}$ cm$^{-1}$. When the density is below this value, variation in strain due to the lattice relaxation will be small and thus there will be little influence on the degree of polarization. The density of misfit dislocations can be, for example, not more than $1\times10^{+6}$ cm$^{-1}$. When the density is above this value, there will be significant influence from degradation of crystal quality to cause reduction in emission intensity. When AlGaN is used instead of GaN, InGaN is subject to greater stress from AlGaN because the AlGaN lattice constants are smaller than the GaN lattice constants.

The inclination angle of the primary surface 13 of the semiconductor region 13 can be not less than 63 degrees and not more than 80 degrees. The inclination angle of the primary surface 25a of the support base 25 can be not less than 63 degrees and not more than 80 degrees. In this gallium nitride based semiconductor light-emitting device, it is feasible to reduce In segregation in the InGaN layer and thus to reduce stress distribution due to this In segregation.

The threading dislocation density of the support base 25 can be not more than $1\times10^{7}$ cm$^{-2}$ in the c-plane. This support base 25 can provide a low-defect semiconductor layer.

Referring again to FIG. 1, the semiconductor region 13 is mounted on the primary surface 25a of the support base 25, and misfit dislocations are generated at an interface J1 between the semiconductor region 13 and the InGaN layer 15 to cause lattice relaxation in the InGaN layer 15. In the light-emitting diode 11a and laser diode 11b, since the semiconductor region 13 and InGaN layer 15 are provided on the support base 25 of GaN, the crystal quality of the semiconductor region 13 becomes excellent, which prevents the anisotropic lattice relaxation in the InGaN layer 15 from becoming weakened, for example, because of defects of the underlying crystal.

In an example, the semiconductor region 13 and the InGaN layer 15 constitute an n-type gallium nitride based semiconductor region 27. The active layer 17 is provided between the n-type gallium nitride based semiconductor region 27 and a p-type gallium nitride based semiconductor region 29. Electrons and holes are injected into the active layer 17 from the n-type gallium nitride based semiconductor region 27 and from the p-type gallium nitride based semiconductor region 29, respectively. In response to this injection, the active layer 17 generates polarized light L. The p-type gallium nitride based semiconductor region 29 can include, for example, an electron block layer 31 and a contact layer 33. The electron block layer 31 can comprise p-type AlGaN, and the contact layer 33 can comprise, for example, p-type GaN or p-type AlGaN. The n-type gallium nitride semiconductor region 27 comprises, for example, n-type GaN. The n-type gallium nitride semiconductor region 27 can include, for example, an n-type AlGaN layer covering the surface of the support base 25.

With reference to FIG. 1, the light-emitting diode 11a has a pair of electrodes 35, 37 for enabling an electric current to flow to the n-type gallium nitride based semiconductor region 27, the active layer 17 and the p-type gallium nitride based semiconductor region 29. In the present example, the electrode 35 is formed so as to be in contact with a back surface 25b of the support base 25 and is, for example, a cathode. The electrode 37 is formed so as to be in contact with a surface of the contact layer 33 and is, for example, an anode.

With reference to FIG. 2, in the laser diode 11b, the n-type gallium nitride based semiconductor region 27 can include an n-type buffer layer 26a and an n-type cladding layer 26b. The n-type buffer layer 26a can comprise, for example, n-type GaN, n-type AlGaN, or the like. The n-type cladding layer 26b can comprise, for example, n-type InAlGaN, n-type AlGaN, or the like. An optical guiding layer 16a includes an InGaN layer 15 and a GaN layer 14. An optical guiding layer 16b can include an InGaN layer 28a and a GaN layer 28b and, if necessary, an electron block layer 31 is located between the InGaN layer 28a and the GaN layer 28b. The active layer 17 is provided between the n-type gallium nitride based semiconductor region 27 and the p-type gallium nitride based semiconductor region 29. Electrons and holes are injected into the active layer 17 from the n-type gallium nitride based semiconductor region 27 and from the p-type gallium nitride based semiconductor region 29, respectively. In the LED mode of the laser diode 11b, the active layer 17 generates polarized light in response to the injection. The p-type gallium nitride based semiconductor region 29 can include, for example, a p-type cladding layer 32 and a contact layer 33 and, if necessary, it can further include an electron block layer 31. The electron block layer 31 can comprise p-type AlGaN. The p-type cladding layer 32 can comprise p-type InAlGaN, p-type AlGaN, or the like. Furthermore, the contact layer 33 can comprise, for example, p-type GaN, p-type InGaN, or p-type AlGaN. The n-type gallium nitride based semiconductor region 27 comprises, for example, n-type GaN. The n-type gallium nitride based semiconductor region 27 can include, for example, an n-type AlGaN layer which covers the surface of the support base 25.

The laser diode 11b has electrodes 35, 37 (anode and cathode) for enabling an electric current to flow to the n-type gallium nitride based semiconductor region 27, the active layer 17 and the p-type gallium nitride based semiconductor region 29. In the present example, the electrode 35 is formed so as to be in contact with the back surface 25b of the support base 25 and is, for example, a cathode. The electrode 37 is formed so as to be in contact with the surface of the contact layer 33 and is, for example, an anode.

An optical waveguide in the laser diode 11b extends in the inclination direction of the c-axis. This laser diode 11b can provide a cavity that enables lasing at a low threshold. The optical waveguide is defined by an extending direction of the electrode 37 or a ridge structure, or the like. Mirrors for the cavity are provided at the two ends of the optical waveguide. In this case, the cavity mirrors are produced as described below. The cavity mirrors can be produced by fracture with a blade so that the laser stripe extends in the inclination direction of the c-axis. A laser bar is produced by break through press on the back side of the substrate. The cavity mirrors can also be formed by any other method than the fracture or cleavage, e.g., dry etching, so as to expose the active layer.

In the laser diode 11b, misfit dislocations are generated at the interface between the semiconductor region 13 and the InGaN layer 15 to cause lattice relaxation in the InGaN layer 15. The lattice relaxation in the InGaN layer 15 changes strain in the active layer 17.

In the laser diode 11b, the misfit dislocations provide the InGaN layer 15 with anisotropic lattice relaxation, in such a manner that there occurs lattice relaxation in the direction to which the reference axis Cx is inclined and that there is no lattice relaxation in the directions perpendicular to the inclination direction and the reference axis Cx. The active layer 17 comes to incorporate anisotropic strain, which is created by the anisotropic lattice relaxation in the InGaN layer 15.

Referring again to FIGS. 1 and 2, the orthogonal coordinate system SP for defining the degree of polarization is shown. The orthogonal coordinate system SP has the X1-axis, X2-axis and X3-axis which are orthogonal to each other. In this orthogonal coordinate system SP, the X2-axis indicates the direction to which the c-axis of the III nitride is inclined. The n-type gallium nitride based semiconductor region 27, the active layer 17 and the p-type gallium nitride based semiconductor region 29 are arranged in the direction of the X3-axis, and the barrier layers 23 and well layers 21 are also arranged in this direction.

In the light-emitting diode 11a and the laser diode 11b, as described previously, the active layer 17 is provided on the anisotropically relaxed InGaN layer 15. Hence, the InGaN layer 15 acts so as to increase the ratio defined by the strain in one direction and the strain in the other direction perpendicular thereto on the well layers 21. The well layers 21 are subject to this anisotropic strain through the barrier layers 23. The anisotropic strain can increase the degree of polarization of the light L.

In the light-emitting diode 11a and the laser diode 11b, as shown in FIG. 5(b), the anisotropic compressive strain on the well layers 21 is effective in increase in the degree of polarization P. Light with polarization greater than the degree of polarization defined by the off angle is generated by the quantum well structure having the large anisotropy of strain on the well layers 21.

In the light-emitting diode 11a, the reference axis Cx can be inclined in a direction in the range of not less than −15 degrees and not more than +15 degrees with respect to the <1-100> direction of gallium nitride of the support base 25. In this case, the major lattice relaxation occurs in the <1-100> direction. Alternatively, the reference axis Cx can be inclined in a direction in the range of not less than −15 degrees and not more than +15 degrees with respect to the <11-20> direction of gallium nitride of the support base 25. In this case, the major lattice relaxation occurs in the <11-20> direction. In these inclination cases as described above, for example, a composite off angle θ is used, which is given by $\theta=(\theta_A^2+\theta_M^2)^{1/2}$. The symbol $\theta_A$ represents the inclination angle to the a-axis direction and the symbol $\theta_M$ represents the inclination angle to the m-axis direction.

In the light-emitting diode 11a and the laser diode 11b, the indium composition of the InGaN layer 15 is preferably not less than 0.02. If the indium composition is too small, the anisotropic lattice relaxation will become unlikely to occur. The indium composition of the InGaN layer is preferably not more than 0.10. If the indium composition is too large, the crystal quality of the InGaN layer will degrade.

Figure 7:
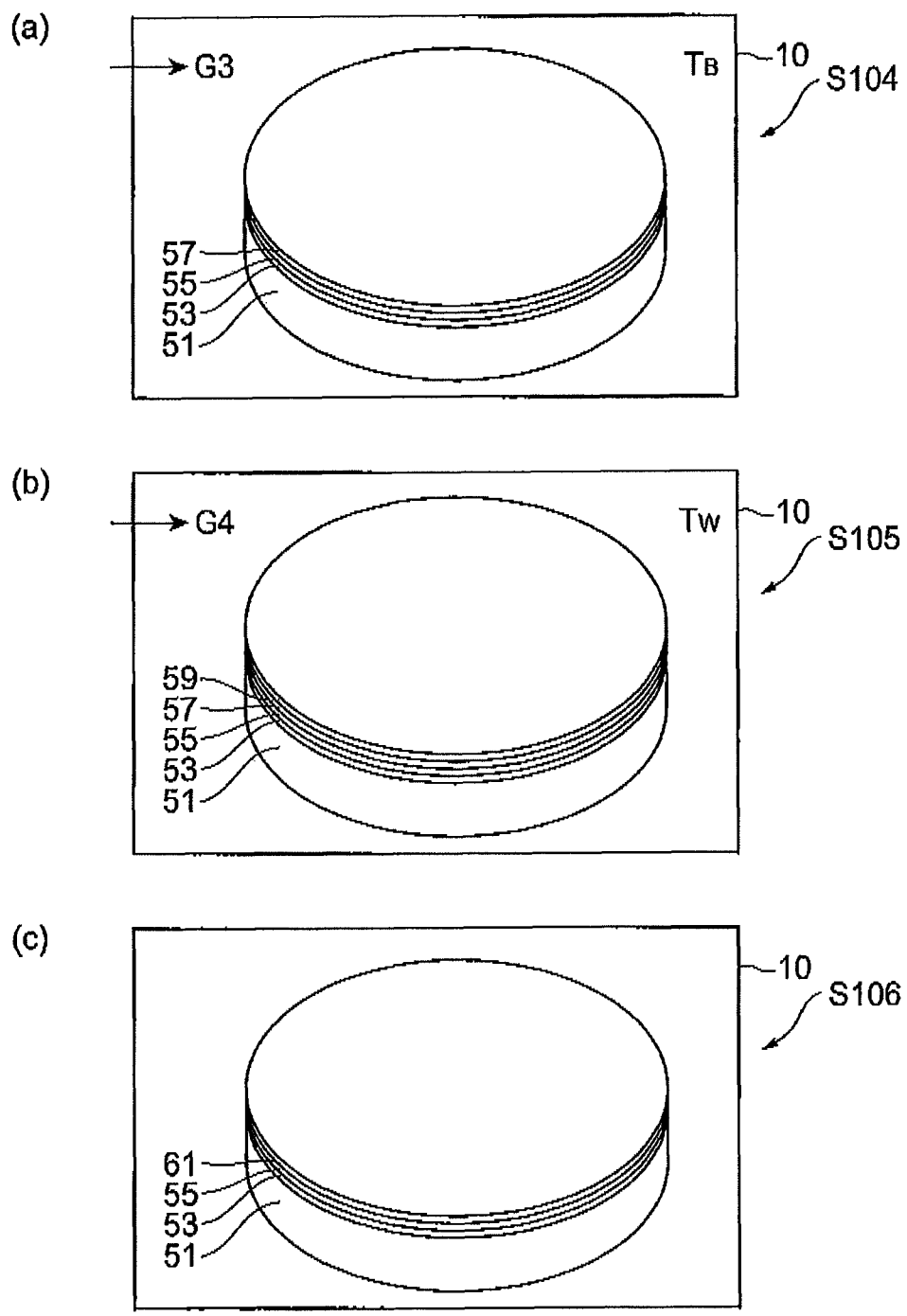
FIG. 7 is a drawing showing major steps in the method for fabricating the gallium nitride based light-emitting diode and the method for fabricating the epitaxial wafer.

With reference to FIGS. 6 to 8, the below will describe major steps in a method for fabricating a nitride semiconductor optical device such as a gallium nitride based light-emitting diode and a gallium nitride based laser diode and a method for fabricating an epitaxial wafer for the nitride-based semiconductor optical device. As shown in FIG. 6(a), in step S101 a substrate 51 is prepared for production of the nitride semiconductor optical device and the epitaxial wafer. The substrate 51 can be comprised, for example, of a hexagonal semiconductor of GaN. Since the substrate 51 is comprised of GaN, it is feasible to perform epitaxial growth with excellent crystal quality. The substrate 51 has a primary surface 51a and a back surface 51b. With reference to FIG. 6(a), a vector VC indicating the c-axis direction of the hexagonal semiconductor of the substrate 51 and a normal vector VN to the primary surface 51a are shown, and the vector VC indicates the direction of the {0001} plane. By use of this substrate 51, the primary surface of an inclination angle (off angle) β can be provided with semipolar nature. The inclination direction of the primary surface 51a of the substrate 51 can be either one direction of the a-axis and the m-axis of the gallium nitride based semiconductor. The inclination angle of the primary surface 51a of the substrate 51 is in the range of not less than 10 degrees and not more than 80 degrees with respect to the {0001} plane of the hexagonal semiconductor. When the inclination angle of the primary surface 51a is below 10 degrees, introduction of misfit dislocations by use of the {0001} plane acting as a slip plane is likely to be promoted, resulting in that the lattice relaxation is more likely to occur.

A maximum Dia of a distance between two points on an edge of the substrate 51 can be not less than 45 mm. The maximum Dia is, for example, the diameter of the substrate. The substrate 51 of this kind is called, for example, a wafer. The back surface 51b of the substrate 51 can be substantially parallel to the substrate 51.

In the subsequent step, a semiconductor crystal is epitaxially grown on the primary surface 51a of the substrate 51. The off angle of the primary surface 51a of the substrate 51 is selected so as to create misfit dislocations enough to cause the anisotropic lattice relaxation at an interface between an InGaN layer of a thickness over a predetermined film thickness and a GaN layer or AlGaN layer. By use of the substrate 51 with the primary surface 51a of the aforementioned inclination angle, the epitaxial semiconductor region is formed so as to increase the anisotropy of strain included in the well layers in the active layer.

The substrate 51 is placed in a growth reactor 10. Prior to film formation, the substrate 51 is subjected to a thermal treatment with supply of gas into the growth reactor 10. This thermal treatment results in forming a modified primary surface. This thermal treatment can be carried out in an atmosphere of a gas containing ammonia and hydrogen. The temperature of the thermal treatment can be, for example, 1000 Celsius degrees. The period for the thermal treatment is, for example, about 10 minutes. This step results in forming a surface structure, which is different from that in the c-plane primary surface, in the semipolar primary surface because of the inclination of the primary surface 51a. Since the primary surface 51a of the substrate 51 is subjected to the thermal treatment prior to the film formation, modification is made in the semiconductor primary surface and cannot be achieved with the c-plane primary surface. An epitaxially grown film of a gallium nitride based semiconductor is deposited on the modified primary surface of the substrate 51. The metal-organic vapor phase epitaxial method is used for this growth. A raw material gas used for the growth contains a gallium source, an indium source, an aluminum source, and a nitrogen source. The gallium source, the indium source, and the nitrogen source are, for example, TMG, TMI, TMA, and $NH_3$, respectively.

As shown in FIG. 6(b), after the thermal treatment, in step S102, the raw material gas G1 is supplied to the growth reactor 10 to epitaxially grow a first conductivity type gallium nitride based semiconductor region 53 on the surface of the substrate 51. The first conductivity type gallium nitride based semiconductor region 53 can include a gallium nitride based semiconductor layer or plural gallium nitride based semiconductor layers, and each gallium nitride based semiconductor layer is comprised of GaN or AlGaN. In the present example, the raw material gas G1 is supplied to the growth reactor 10 for the growth. An n-type GaN layer is grown on the substrate 51 at 950 Celsius degrees. The n-type GaN layer is prepared for, for example, a layer for supplying n-type carriers, and the thickness of the n-type GaN layer is 2000 nm. A primary surface of the n-type GaN layer has semipolar nature.

After the thermal treatment, if necessary, an n-type AlGaN layer is grown on the substrate 51. A GaN buffer layer can be grown instead of the growth of the n-type AlGaN layer. The n-type AlGaN layer is, for example, an intermediate layer which covers the entire surface of the substrate 51 and is grown, for example, at 1100 Celsius degrees. The n-type AlGaN layer has, for example, the thickness of 50 nm. At this time, the gallium nitride based semiconductor region 53 can include the n-type AlGaN layer and n-type GaN layer which can be prepared for an n-type gallium nitride based semiconductor layer. The n-type AlGaN layer and the n-type GaN layer are epitaxially grown in order on the semipolar primary surface of the substrate 51. A primary surface 53a of the gallium nitride based semiconductor region 53 has an off angle associated with the off angle of the primary surface 51a of the substrate 51, and exhibits semipolar nature. When the nitride-based semiconductor optical device includes a laser diode, an n-type cladding layer is grown after the growth of the buffer layer and the intermediate layer. Furthermore, an AlGaN layer or InAlGaN layer can be used as an n-type cladding layer.

Next, as shown in FIG. 6(c), a raw material gas G2 is supplied into the growth reactor 10, and an n-type InGaN layer 55 is grown at 840 Celsius degrees directly on the semipolar primary surface of the n-type GaN layer 53 in step S103. The n-type InGaN layer 55 is provide for, for example, a lattice-relaxed layer in order to induce the anisotropic lattice relaxation and, preferably, an active layer is grown directly on this lattice-relaxed layer. For this purpose, the thickness of the n-type InGaN layer 55 is not less than 150 nm. Furthermore, the thickness of the n-type InGaN layer 55 is preferably not less than 100 nm. For applying sufficient stress to the n-type InGaN layer 55 during the growth, the thickness of the semiconductor region 53 is larger than the thickness of the InGaN layer. The indium composition of the InGaN layer 55 is preferably not less than 0.02. If the indium composition is too small, the anisotropic lattice relaxation will be less likely to occur. The indium composition of the InGaN layer is preferably not more than 0.10. If the indium composition is too large, the crystal quality of the InGaN layer 55 will degrade, which is unfavorable for growth of the active layer. The indium composition and thickness of the InGaN layer 55 are determined so as to produce misfit dislocations in a predetermined density or more at an interface J2 between the InGaN layer 55 and the gallium nitride based semiconductor region 53. The misfit dislocations in the InGaN layer 55 can be, for example, not less than $5 \times 10^{+2}$ cm$^{-1}$, and the reason for it is that if the density is below this value, change in strain due to the lattice relaxation will be small and thus there will be little influence on the degree of polarization. Furthermore, the misfit dislocations in the InGaN layer 55 can be, for example, not more than $1 \times 10^{+6}$ cm$^{-1}$, and if the density is above this value, influence of degradation of crystal quality will be significant, thereby causing reduction in emission intensity. The primary surface 53a of the gallium nitride based semiconductor region 53 is inclined with respect to a plane perpendicular to a reference axis which extends in a direction of the [0001] axis in the primary surface, and this inclination enables creation of slip planes for misfit dislocations. When the nitride based semiconductor optical device includes a laser diode, the InGaN layer 55 acts as an optical guiding layer. The optical guiding layer applicable herein can be a combination of an InGaN layer and a GaN layer. In this structure, the GaN layer of the optical guiding layer is located between the InGaN layer 55 and the cladding layer, and stress from GaN of the substrate or the cladding layer is applied through the GaN layer of the optical guiding layer to the InGaN layer 55.

In the next step, an active layer of a nitride based semiconductor light-emitting diode or a laser diode is formed. The active layer is provided so as to generate an emission spectrum with a peak wavelength in a wavelength range of not less than 440 nm and not more than 550 nm, for example.

In this method, there is a large difference in lattice constant between semiconductor region 53 and InGaN layer 55. When the InGaN layer 55 having the thickness of not less than 150 nm is grown on this semiconductor region 53, misfit dislocations are produced at the interface J2 between the InGaN layer 55 and the semiconductor region 53. In the InGaN layer 55, the misfit dislocations permit anisotropic lattice relaxation which is associated with the inclination direction of the primary surface 53a of the semiconductor region 53. When the active layer is grown on the InGaN layer 55, significantly anisotropic stress is applied to the active layer.

Furthermore, the primary surface 55a of the InGaN layer 55 can have a streaky morphology which extends in a direction intersecting with the inclination direction of the reference axis Cx. This surface morphology is associated with a slip plane of misfit dislocations.

In step S104, as shown in FIG. 7(a), a raw material gas G3 is supplied to the growth reactor 10 for growing a barrier layer 57 comprising a gallium nitride based semiconductor in step S104. The raw material gas G2 is supplied to the growth reactor 10 to grow the barrier layer 57 on the InGaN layer 53 at a growth temperature $T_B$. The growth temperature $T_B$ is, for example, not less than 700 Celsius degrees and not more than 900 Celsius degrees. This barrier layer 57 comprises In$_Y$Ga$_{1-Y}$N (indium composition Y: $0 \leq Y \leq 0.02$, where Y is a strain composition), e.g., GaN or InGaN. In the present example, the raw material gas G3 containing a gallium source and a nitrogen source is supplied to the growth reactor 10 to grow undoped GaN at 900 Celsius degrees. The thickness of the GaN barrier layer is, for example, 15 nm. The thickness of the barrier layer 57 is, for example, in the range of not less than 4 nm and not more than 30 nm. Since the barrier layer 57 is grown on the primary surface 55a, the surface of the barrier layer 57 also exhibits semipolar nature.

After completion of the growth of the barrier layer 57, the supply of the gallium source is terminated to stop the growth of the gallium nitride based semiconductor. After the growth of the barrier layer 57 and prior to growth of a well layer, the temperature of the growth reactor is changed from the growth temperature $T_B$ to a growth temperature $T_W$. During this change period, a nitrogen source gas, e.g., ammonia is supplied into the growth reactor 10.

In step S105, as shown in FIG. 7(b), a well layer 59 for a quantum well structure is grown on the barrier layer 57, while the temperature of the growth reactor 10 is kept at the well layer growth temperature $T_W$. The well 57 comprises a gallium nitride based semiconductor containing indium, such as In$_X$Ga$_{1-X}$N (indium composition X: $0 \leq X \leq 1$, where X is a strain composition). The well layer 59 has a bandgap energy smaller than that of the barrier layer 57. The growth temperature $T_W$ is, for example, not less than 650 Celsius degrees and not more than 850 Celsius degrees, and the growth temperature $T_W$ of the well layer 59 is lower than the growth temperature $T_B$. In the present example, a raw material gas G4 containing a gallium source, an indium source and a nitrogen source is supplied to the growth reactor 10 to grow undoped InGaN. The thickness of the well layer 59 can be not less than 1.5 nm and not more than 20 nm. The indium composition X of the In$_X$Ga$_{1-X}$N well layer 59 can be larger than 0.13. In$_X$Ga$_{1-X}$N of the well layer 59 can be smaller than 0.3. InGaN can be grown in an indium composition in this range, and then a light-emitting device can be obtained at the wavelength of not less than 440 nm and not more than 550 nm. The growth temperature $T_W$ of the well layer 59 is, for example, 700 Celsius degrees. The thickness of the InGaN well layer is, for example, 3 nm. Since a primary surface of the well layer 59 is epitaxially grown on the primary surface of the barrier layer 57, the well layer 59 has a semipolar surface as the barrier layer 57 has.

In step S106 the foregoing growth steps are repeatedly carried out in the same manner to grow an active layer 61 in the quantum well structure as shown in FIG. 7(c). The active layer 61 includes, for example, three well layers 59 and four barrier layers 57. After this growth, a necessary semiconductor layer or layers are grown to form a light-emitting layer.

Next, a second conductivity type gallium nitride based semiconductor region is epitaxially grown on the active layer 61. As shown in FIG. 8(a), in step S107, a raw material gas G5 is supplied to the growth reactor 10 to grow an electron block layer 63 on the active layer 61. In the present example, the electron block layer 63 can comprise, for example, AlGaN. The thickness of this AlGaN is, for example, 20 nm. A primary surface of the p-type AlGaN layer exhibits semipolar nature. The growth temperature of the electron block layer 63 is, for example, 1000 Celsius degrees. When the nitride-based semiconductor optical device includes a laser diode, an optical guiding layer including the InGaN layer 55 is grown prior to the second conductivity type gallium nitride based semiconductor region. Furthermore, the optical guiding layer can include a combination of an InGaN layer and a GaN layer. In this structure, the GaN layer of the optical guiding layer is located between the InGaN layer and the active layer 61. After formation of the optical guiding layer, the electron block layer can be formed. Alternatively, after the growth of the InGaN layer of the optical guiding layer, the electron block layer can be grown prior to the growth of the GaN layer of the optical guiding layer.

As shown in FIG. 8(b), in step S108, a raw material gas G6 is supplied to the growth reactor 10 to grow a p-type contact layer 65 on the electron block layer 63. In the present example, the p-type contact layer 65 can comprise, for example, p-type GaN. The thickness of this GaN is, for example, 50 nm. A primary surface of the p-type GaN layer exhibits semipolar nature. The growth temperature of the p-type contact layer 65 is, for example, 1000 Celsius degrees. When the nitride based semiconductor optical device includes a laser diode, a p-type cladding layer is grown prior to the growth of the p-type contact layer 65. The p-type cladding layer applicable herein is, for example, an AlGaN layer or an InAlGaN layer.

After formation of the p-type gallium nitride based semiconductor region 67, an epitaxial wafer E is completed as shown in FIG. 8(c). In the epitaxial wafer E, the n-type gallium nitride based semiconductor region 53, the InGaN layer 55, the active layer 61 and the p-type gallium nitride based semiconductor layer 67 are arranged in the direction of the axis normal to the primary surface 51c of the substrate 51. The direction of the c-axis of the hexagonal semiconductor of the substrate 51 is different from the direction of the axis normal to the primary surface 51c of the substrate 51. A growth direction of the epitaxial growth is the c-axis direction, and the c-axis direction is different from the lamination direction, which is oriented to the axis normal to the primary surface 51c of the substrate 51, of the semiconductor layers 53, 55, 61 and 67.

In the next step, electrodes are formed on the epitaxial wafer E. The first electrode (e.g., an anode electrode) is formed on the contact layer 65, and the second electrode (e.g., a cathode electrode) is formed on the back surface 51b of the substrate.

With regard to the direction of inclination of the primary surface 51a of the substrate 51, when the primary surface 51a is inclined toward the a-axis direction of the hexagonal semiconductor of the substrate 51, the epitaxial substrate produced on the substrate 51 undergoes lattice relaxation in the a-axis direction so as to increase the magnitude of light polarized in the m-axis direction, and the direction of polarization can be made coincident with the m-axis direction of an end face of an LED chip formed by dicing in the a-axis and m-axis directions and separated by cutting into a rectangular shape. Furthermore, when the primary surface 51a of the substrate 51 is inclined toward the m-axis direction of the hexagonal semiconductor of the substrate 51, lattice relaxation occurs in the m-axis direction so as to increase the magnitude of light polarized in the a-axis direction, and the direction of polarization can be made coincident with the a-axis direction of an end face of an LED chip formed by dicing in the a-axis and m-axis directions and separated by cutting in a rectangular shape. The knowledge from these measurements of the LED operation is applicable to operation in the LED mode of laser diodes.

In this epitaxial wafer E, the semiconductor region 53 comprises GaN or AlGaN having a lattice constant smaller than that of the InGaN layer 55, and the thickness of the semiconductor region 53 is larger than that of the InGaN layer 55. Furthermore, the semiconductor region 53 comprises InGaN or InAlGaN having a lattice constant smaller than that of the InGaN layer 55, and the thickness of the semiconductor region 53 is larger than that of the InGaN layer 55. When the thickness of the InGaN layer 55 is not less than 150 nm, the InGaN layer 55 is strained so that this InGaN layer 55 undergoes anisotropic lattice relaxation. The anisotropy of strain therefore increases in the active layer 61 on the primary surface 55a of the InGaN layer 55. As a consequence, the epitaxial wafer E is provided with the active layer 61 strained anisotropically.

EXAMPLE 1

A GaN substrate is prepared. A primary surface of this GaN substrate is inclined at the off angle in the range of 16.3 degrees to 16.7 degrees with respect to a c-plane toward the a-axis direction.

An epitaxial wafer having an LED structure is fabricated through the following procedure by the metal-organic chemical vapor deposition method. The raw materials used herein are as follows: trimethyl gallium (TMG), trimethyl aluminum (TMA), trimethyl indium (TMI), bis(cyclopentadienyl) magnesium ($Cp_2Mg$), silane ($SiH_4$), and ammonia ($NH_3$). The GaN substrate is placed on a susceptor in a reaction chamber and thereafter $NH_3$ and $H_2$ are supplied into the growth reactor under the pressure in the reactor controlled at 101 kPa, followed by a thermal treatment of the GaN substrate at the substrate temperature of 1050 Celsius degrees. The period of time for this thermal treatment is, for example, 10 minutes. After that, TMG, TMA, and $SiH_4$ are supplied to grow a Si-doped $Al_{0.08}Ga_{0.92}N$ buffer layer. The thickness of the n-type $Al_{0.08}Ga_{0.92}N$ buffer layer is, for example, 50 nm. The supply of TMA is stopped to grow a Si-doped GaN layer. The thickness of this n-type GaN layer is 2000 nm. The supply of TMG and $SiH_4$ is stopped and thereafter the substrate temperature is decreased to 780 Celsius degrees. TMG and TMI are supplied into the growth reactor to grow an $In_{0.03}Ga_{0.97}N$ layer in the thickness of 100 nm, 300 nm, or 1000 nm. An active layer is grown on the InGaN layer in a 3-cycle multiple quantum well structure including GaN barrier layers of 14 nm and InGaN well layers of 4 nm. Thereafter, the supply of TMG and TMI is stopped, the substrate temperature is increased to 1000 Celsius degrees, and thereafter TMG, TMA, $NH_3$, and $Cp_2Mg$ are supplied into the growth reactor to grow a Mg-doped p-type $Al_{0.08}Ga_{0.92}N$ layer in the thickness of 20 nm. After this growth, the supply of TMA is stopped to grow a p-type GaN layer in the thickness of 50 nm.

After completion of the growth, the temperature of the epitaxial wafer is decreased to room temperature, and the epitaxial wafer is taken out of the growth reactor. The surface of the epitaxial wafer is observed with a Nomarski differential interference microscope. FIG. 9 shows differential interference microscope images of surfaces of respective epitaxial wafers observed at a relatively high magnification ratio of 1000. Arrows $A_{OFF}$ indicate the inclination direction of the c-axis.

With reference to FIG. 9(a), when the InGaN layer has a thickness of 100 nm, the surface of the InGaN layer is made flat. With reference to FIG. 9(b), in the InGaN layer in the thickness of 300 nm, the surface morphology observed shows a streaky form extending linearly in a direction perpendicular to the direction inclined with respect to the c-axis. The misfit dislocations change the growth mode. This morphology indicates that the change of the growth mode is formed along the misfit dislocations. With reference to FIG. 9(c), in the InGaN layer in the thickness of 1000 nm, a surface morphology observed has a streaky form extending linearly in the direction perpendicular to the inclination direction from the c-axis. This morphology indicates that the change of the growth mode is formed along the misfit dislocations.

The epitaxial wafers with the three types of film thicknesses are evaluated by X-ray diffractometry. The slit size of incident X-rays is 0.2 mm horizontal×2 mm vertical.

Figure 10:
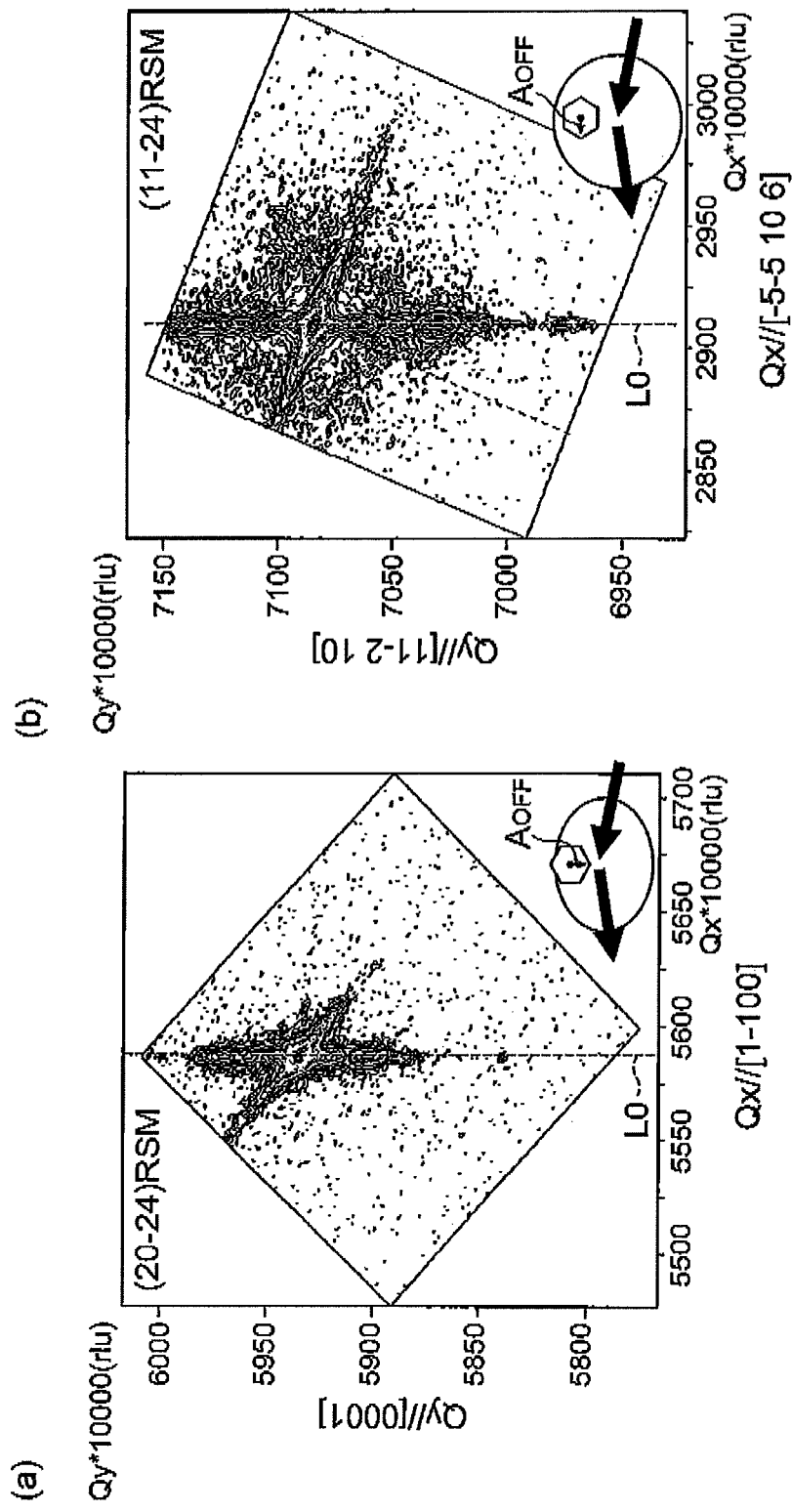
FIG. 10 is a drawing showing the measurement results of X-ray diffraction of GaN and an InGaN layer with the thickness of 100 nm.
Figure 11:
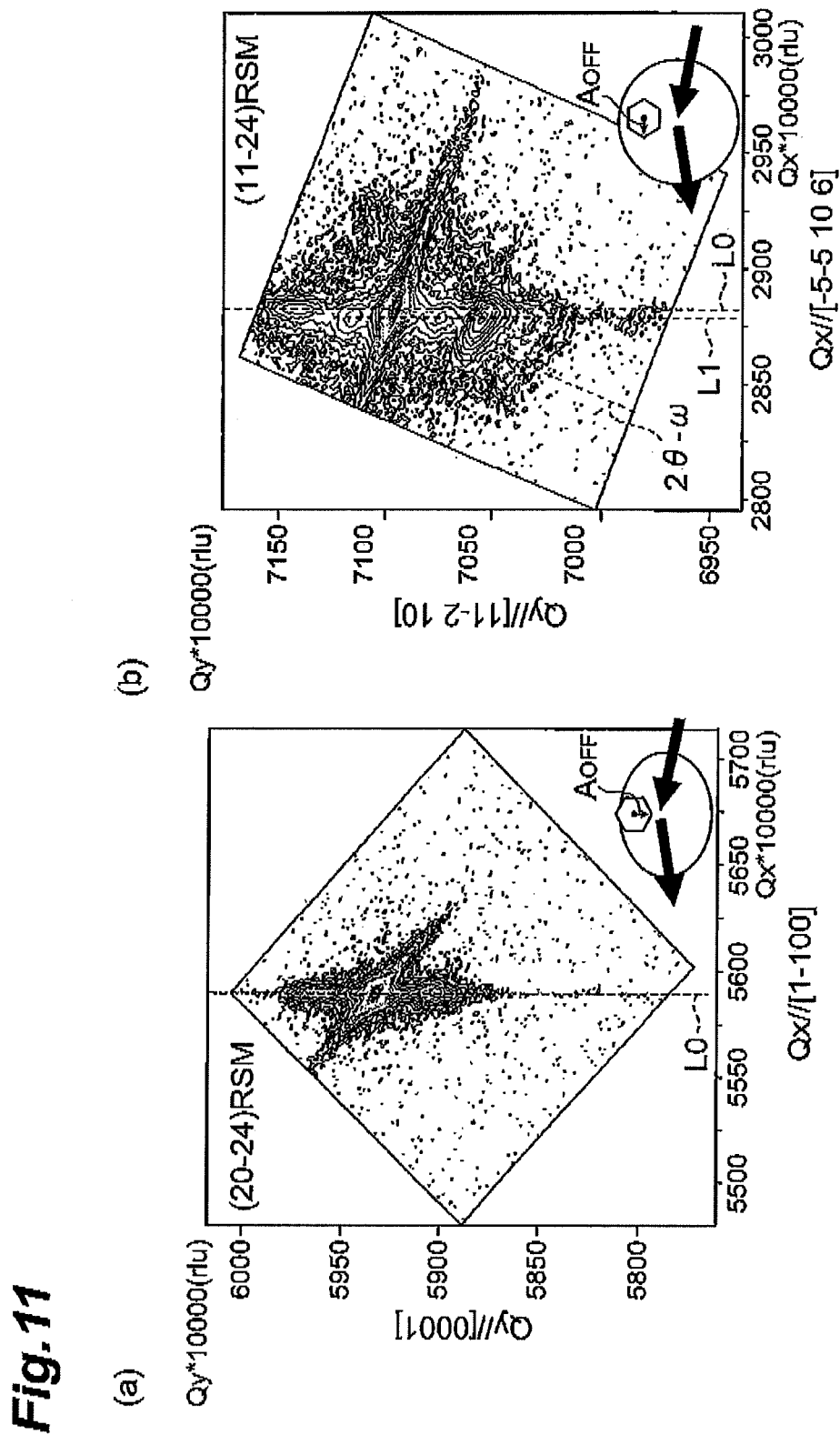
FIG. 11 is a drawing showing the measurement results of X-ray diffraction of GaN and an InGaN layer with the thickness of 300 nm.
Figure 12:
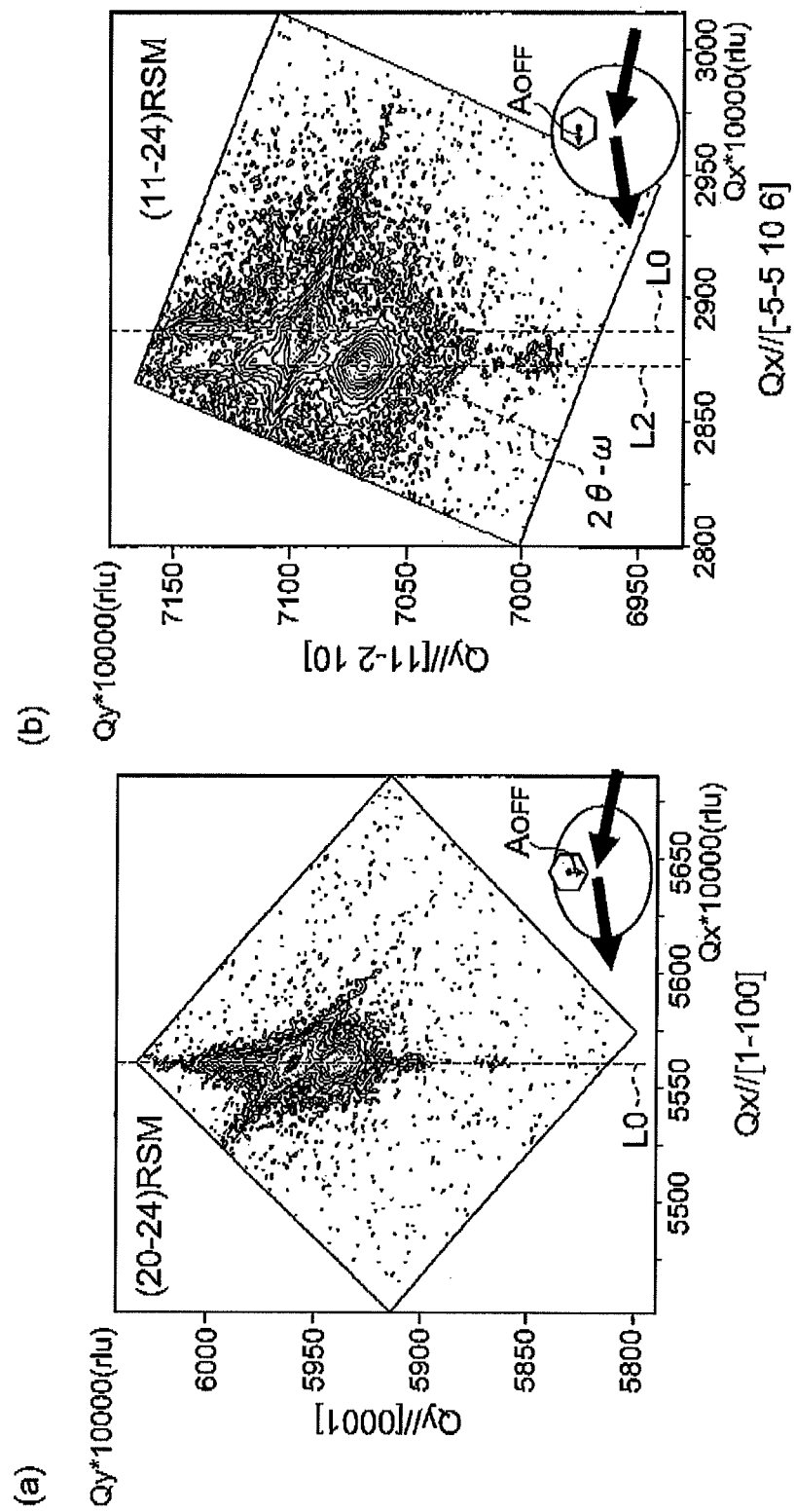
FIG. 12 is a drawing showing the measurement results of X-ray diffraction of GaN and an InGaN layer with the thickness of 1000 nm.

The measurement of X-ray diffraction includes observation with incidence of X-rays in the direction perpendicular to the off direction and observation with incidence of X-rays in the direction parallel to the off-direction. The plane orientations measured with the perpendicular incidence and parallel incidence are (20-24) plane and (11-24) plane, respectively. FIGS. 10 to 12 are drawings showing the measurement results of X-ray diffraction.

With reference to FIG. 10, an X-ray diffraction image of the InGaN layer in the thickness of 100 nm shows that a peak of the GaN substrate and a peak of the InGaN layer are vertically arranged on a line L0 in both of the measurements of the (20-24) plane and (11-24) plane, and this arrangement indicates that the InGaN layer is coherently grown on the GaN substrate.

On the other hand, with reference to FIG. 11, the peak of the GaN substrate and the peak of the InGaN layer are vertically arranged in the measurement of the (20-24) plane in the case of the InGaN layer having the thickness of not less than 300 nm, and this arrangement indicates that the InGaN layer is coherently grown on the GaN substrate. However, in the measurement of the (11-24) plane in the InGaN layer having the thickness of not less than 300 nm, the peak of the GaN substrate and the peak of the InGaN buffer layer are not vertically arranged, with the GaN peak being located on a line L0 and with the InGaN peak being located on a line L1. This arrangement indicates that the InGaN layer includes lattice relaxation.

Furthermore, with reference to FIG. 12, in the InGaN buffer layer having a thickness of 1000 nm, the peak of the InGaN layer in the (11-24) plane is located in an upper left position with respect to a line of 2θ-ω scan on which the peak of the GaN substrate is located. The GaN peak is located on a line L0 and the InGaN peak on a line L1. This indicates that tensile strain is exerted in the off direction and that in this epitaxial wafer the deformation in the off direction is stabler in energy than elastic deformation in the c-axis direction.

It is understood from these experiments and further additional experiments that the lattice relaxation occurs with anisotropy when the InGaN layer is grown in the thickness of not less than 150 nm. The anisotropic lattice relaxation is promoted only in the off direction of the c-axis of the underlying gallium nitride based semiconductor.

Figure 13:
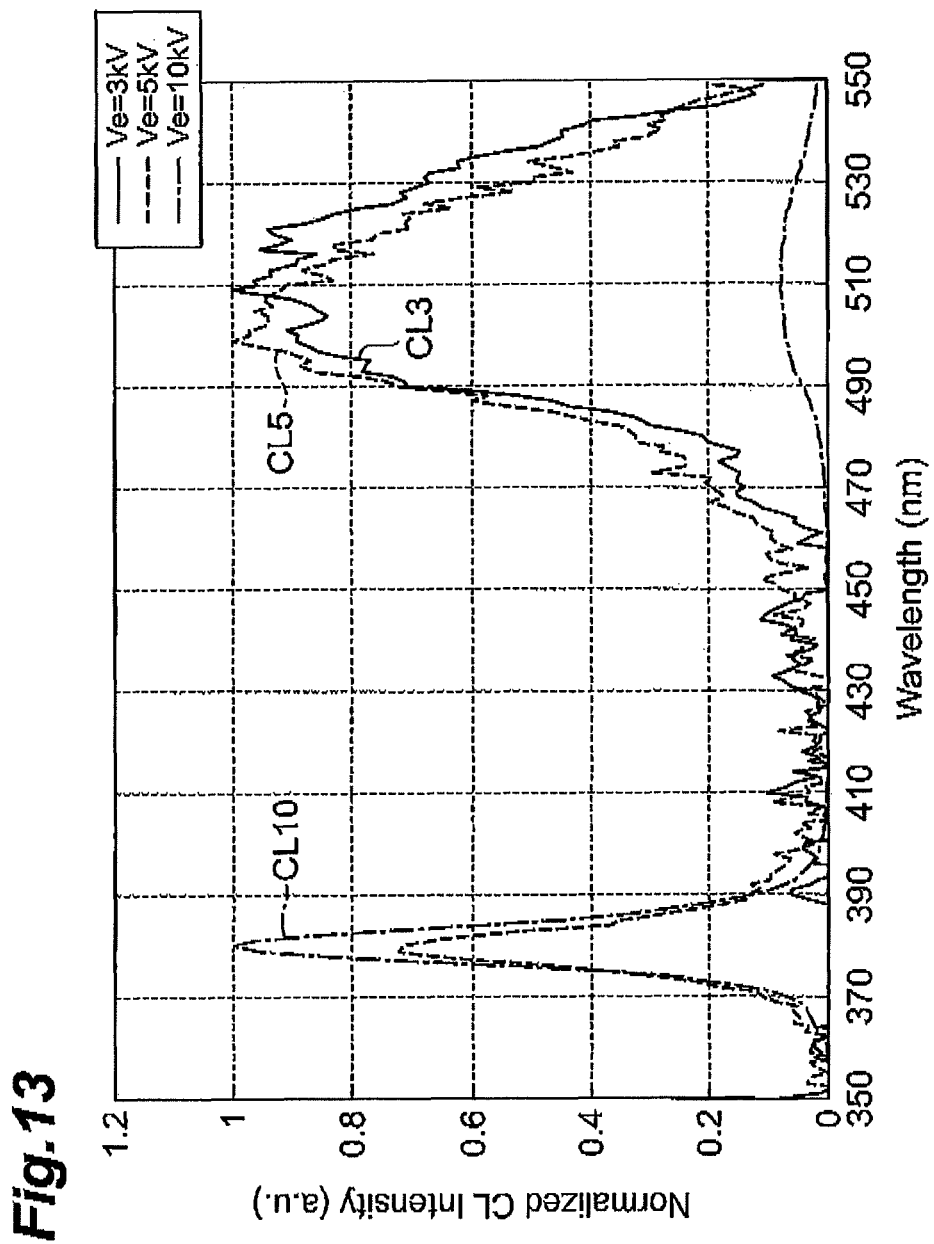
FIG. 13 is a drawing showing cathodoluminescence (CL) images in a light-emitting based diode structure including an InGaN layer with the thickness of 300 nm.

FIG. 13 shows a cathodoluminescence (CL) image in the light-emitting diode structure including the InGaN layer in the thickness of 300 nm. The CL evaluation can provide information about the layer undergoing lattice relaxation.

Since this CL evaluation can be performed with change in the penetration length of an electron beam which depends upon an acceleration voltage, CL emission from the active layer and CL emission from the InGaN layer are obtained separately. Specifically, characteristic lines CL3, CL5 and CL10 indicate CL intensities at the acceleration voltages of 3 kV, 5 kV, and 10 kV, respectively. The electron beam penetration length is approximately 30 nm to 60 nm at the acceleration voltage of 3 kV, and the electron beam penetration length is approximately 50 nm to 200 nm at the acceleration voltage of 5 kV; therefore, the emission in the active layer can be obtained in each of such depths. Since the electron beam penetration length is approximately 300 nm to 600 nm at the acceleration voltage of 10 kV, the CL emission in the InGaN layer can be obtained.

FIG. 14 shows CL images at the acceleration voltages of 3 kV, 5 kV and 10 kV. With reference to FIG. 14(a) and FIG. 14(b), no linear dark regions are observed at the acceleration voltages of 3 kV and 5 kV. With reference to FIG. 14(c), dark lines extending perpendicularly to the off direction are observed at the acceleration voltage of 10 kV. As shown in FIG. 14, it is understood that dislocations extends horizontally in the InGaN layer. It is therefore considered that misfit dislocations are generated at the interface between the InGaN layer and the GaN layer of the epitaxial wafer. As shown in the CL image at the acceleration voltage of 3 kV, the linear defects do not penetrate the active layer. Hence, the misfit dislocations in the InGaN layer are not a major factor to degrade the emission intensity.

The foregoing epitaxial wafer is subjected to a device process. Steps for the device process are carried out according to the following procedure: formation of a mesa in the depth of 500 nm by dry etching (e.g., RIE), formation of p-transparent electrode (Ni/Au), formation of p-pad electrode (Au), formation of n-electrode (Ti/Al), and electrode annealing (at 550 Celsius degrees for one minute). Photolithography, ultrasonic cleaning, etc. are carried out between the respective steps.

On-wafer devices without separation into semiconductor chips are energized to evaluate electrical and optical properties thereof. An electric current of 120 mA (in the current density of 75 A/cm$^2$) is applied to each chip of 400 μm×400 μm to obtain characteristics of emission wavelength, optical output and operating voltage. With the LED chips of 100 nm, 300 nm and 1000 nm, the characteristics of emission wavelength, optical output, and operating voltage are approximately equivalent. Underlying InGaN;

Lattice-relaxed layer: 100 nm, 300 nm, 1000 nm;
Emission wavelength (nm): 500 nm, 502 nm, 503 nm;
Optical output (mW): 1.1, 2.1, 2.0;
Operating voltage (V): 3.9, 3.8, 3.7;
Degree of polarization: 0.33, 0.40, 0.50.

In the measurement result of the polarization degree, as shown in FIG. 15(a), the degree of polarization monotonically increases with increase in the thickness of the underlying InGaN lattice-relaxed layer in the thickness range of not less than 150 nm. Specifically, the degree of polarization of the InGaN lattice-relaxed layer with the thickness of 160 nm is larger than that of the InGaN lattice-relaxed layer with the thickness of 150 nm. The degree of polarization of the InGaN lattice-relaxed layer with the thickness of 170 nm is larger than that of the InGaN lattice-relaxed layer with the thickness of 160 nm. The degree of polarization of the InGaN lattice-relaxed layer with the thickness of 180 nm is larger than that of the InGaN lattice-relaxed layer with the thickness of 170 nm. The degree of polarization of the InGaN lattice-relaxed layer with the thickness of 190 nm is larger than that of the InGaN lattice-relaxed layer with the thickness of 180 nm. The degree of polarization of the InGaN lattice-relaxed layer with the thickness of 200 nm is larger than that of the InGaN lattice-relaxed layer with the thickness of 190 nm. The degree of polarization of the InGaN lattice-relaxed layer with the thickness of 250 nm is larger than that of the InGaN lattice-relaxed layer with the thickness of 200 nm. The degree of polarization of the InGaN lattice-relaxed layer with the thickness of 350 nm is larger than that of the InGaN lattice-relaxed layer with the thickness of 300 nm. The degree of polarization of the InGaN lattice-relaxed layer with the thickness of 450 nm is larger than that of the InGaN lattice-relaxed layer with the thickness of 400 nm.

FIG. 15(b) shows dependence of emission strength on rotation angle of a polarizer. Since the emission intensity varies depending upon the rotation angle, light L has polarization. The degree of polarization is represented by Eq (1) below.

$$P=(I_{MAX}-I_{MIN})/(I_{MAX}+I_{MIN}) \quad (1)$$

$I_{MAX}$: maximum of emission intensity
$I_{MIN}$: minimum of emission intensity When the thickness of the InGaN lattice-relaxed layer is increased to 150 nm or more, the degree of polarization increases from 0.33 to 0.4; when the thickness of the InGaN lattice-relaxed layer is increased to 300 nm or more, the degree of polarization increases from 0.33 to 0.5. This is because the lattice relaxation makes the lattice constant in the off direction closer to a value in a strain-free state to enhance optical anisotropy, thereby increasing the degree of polarization. The present example describes the LED structure, but the knowledge about the InGaN layer obtained from the present experiments of the LED structure also applies to the relation between the active layer and the InGaN optical guiding layer in the laser (LD) structure.

EXAMPLE 2

Figure 16:
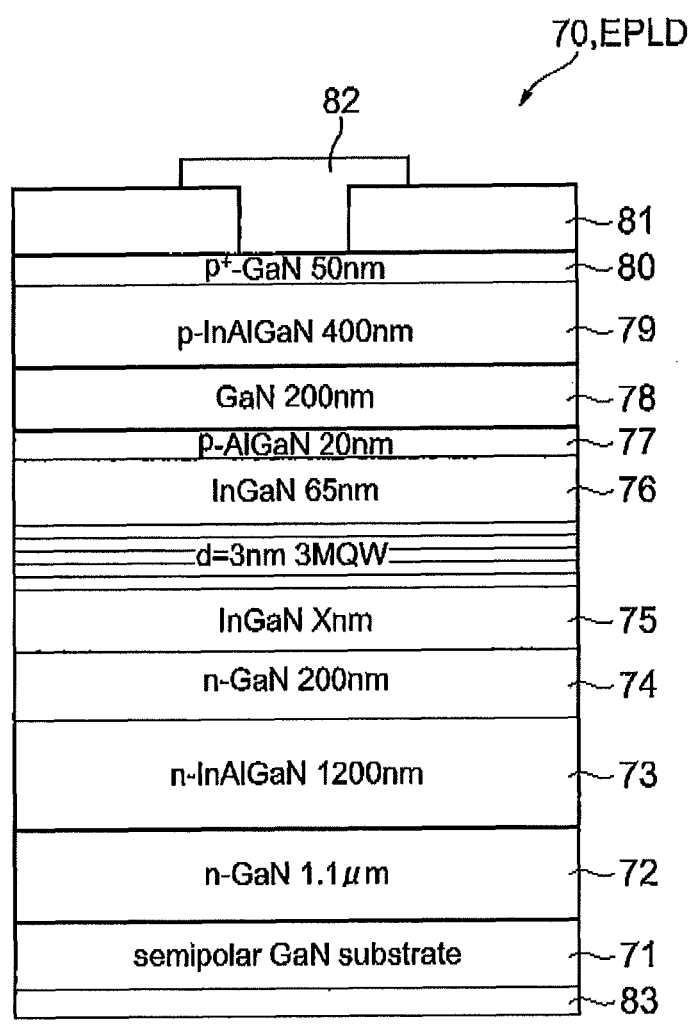
FIG. 16 is a drawing showing a structure of a laser diode produced in Example 2.

FIG. 16 is a drawing showing a laser diode structure 70 produced in Example 2. As described below, an epitaxial substrate EPLD for the laser diode shown in FIG. 16 is grown by the metal-organic vapor phase epitaxial method. The raw materials used herein are as follows: trimethyl gallium (TMGa), trimethyl aluminum (TMAl), trimethyl indium (TMIn), ammonia (NH$_3$), and silane (SiH$_4$). A thick (0001) GaN ingot, grown by the HVPE process is cut at the angle of 75 degrees toward the m-axis direction to form a GaN piece for GaN substrate. The surface of the cut GaN piece is polished to fabricate a semipolar {20-21} GaN substrate 71.

This GaN substrate 71 is placed on a susceptor in a reaction chamber, and then epitaxial layers are grown according to the following growth procedure. First, an n-type GaN layer 72 is grown in the thickness of 1.1 µm on the GaN substrate 71. Next, an n-type InAlGaN cladding layer 73 is grown in the thickness of 1.2 µm on the n-type GaN layer 72. An n-type GaN guide layer 74 is grown in the thickness of 0.2 µm on the n-type InAlGaN cladding layer 73. An undoped InGaN guide layer 75 is grown on the n-type GaN guide layer 74. Epitaxial substrates are fabricated with the undoped InGaN guide layer 75 in different thicknesses. After the growth of the guide layers 74 and 75, an active layer 76 is grown directly on the InGaN guide layer 75. This active layer 76 includes a 3-cycle MQW of layers of GaN 10 nm thick/InGaN 3 nm thick. A p-type InGaN guide layer 76 of 0.065 µm thickness, a p-type AlGaN block layer 77 of 0.020 µm thickness, and a p-type GaN guide layer 78 of 0.2 µm thickness are successively grown on the active layer 75. A p-type InAlGaN cladding layer 79 is grown in the thickness of 0.4 µm on the GaN guide layer 78. A p-type GaN contact layer 80 is grown in the thickness of 0.05 µm on the p-type InAlGaN cladding layer 79. Epitaxial substrates EPLD are obtained through these steps.

An insulating film 81 of silicon oxide film (e.g., SiO$_2$) is deposited on the contact layer 80 and then a stripe window is formed thereon in the width of 10 µm by photolithography and wet etching. An extending direction of a laser stripe is parallel to the inclination direction (off direction) of the c-axis. After formation of the stripe window, a p-side electrode 82 of Ni/Au and a pad electrode of Ti/Al are formed thereon. Then the back surface of the GaN substrate (GaN wafer) is polished using diamond slurry to produce a substrate product having the back surface in a mirror finish state. An n-side electrode 83 of Ti/Al/Ti/Au is formed by vapor deposition on the back surface (polished surface) of the GaN substrate (GaN wafer).

The mirrors for optical cavity are produced as described below. They are produced with a laser scriber using the YAG laser at the wavelength of 355 nm. The conditions for formation of scribed grooves are as follows: laser beam output 100 mW; scanning speed 5 mm/s. The scribed grooves thus formed are, for example, grooves of the length of 30 µm, the width of 10 µm, and the depth of 40 µm. The laser beam is applied directly to the epitaxial surface through apertures of the insulating film on the substrate at the pitch of 800 µm, thereby forming the scribed grooves. The cavity length is 600 µm. On the substrate product with the electrodes thereon, the cavity mirrors are produced by fracture using a blade.

The production of mirrors for optical cavity will be described. Since the laser stripe extends in the direction of inclination of the c-axis, it is infeasible to obtain end faces for the cavity mirrors by ordinary cleavage of a-planes, c-planes, m-planes, or the like. However, it is feasible to produce a pair of fractured faces by implementing break by press on the back surface of the substrate, after formation of the scribed grooves as described above. The fractured faces of a semiconductor piece of bar-shape produced by the break have flatness enough to be applicable to the cavity mirrors and have perpendicularity to the direction of the laser stripe. The flatness and perpendicularity are achieved at least in part around the end faces of the active layer. In the description hereinafter, the semiconductor piece of bar-shape produced by the break will be referred to as a laser bar. It is also possible to form the cavity mirrors by any other method than the fracture or cleavage, e.g., by dry etching to expose the active layer.

The end faces (fractured faces) of the laser bar are coated with a dielectric multilayer film by the vacuum evaporation method. The dielectric multilayer film is composed of an alternate stack of SiO$_2$ and TiO$_2$. Each of thicknesses is adjusted in the range of 50 to 100 nm so that the center wavelength of reflectance can fall within the range of 500 to 530 nm. A multilayer film of ten cycles is deposited as a reflecting film on one end face, whereby the designed reflectance in the present example is about 95%. A multilayer film of six cycles is deposited as a reflecting film on the other, whereby the designed reflectance in the present example is about 80%.

Each of the laser diodes produced through these steps is energized. The evaluation by energization is carried out at room temperature. A pulse power supply is used for the energization to apply pulses with the duty ratio of 0.1% and the pulse width of 500 ns to each laser diode. For the application, needles are brought into contact with the electrodes on the surfaces of the laser diode. For measuring optical output, emission from the end face of the laser bar is detected with a photodiode to measure the electric current-optical output characteristic (I-L characteristic). For measuring the emission wavelength, the emission from the end face of the laser bar is guided through an optical fiber to a detector (e.g., a spectrum analyzer) to perform spectrum measurement of emission from the laser diode. For measuring the polarization state, a polarizing plate is placed between the laser bar and a detector, and the polarization state of emission from the laser bar is measured while rotating the polarizing plate. For measuring the LED-mode light, one end of an optical fiber is positioned to the top surface of the laser bar to measure light emitted from the top surface of the laser bar instead of the end face of the laser bar.

The polarization state after lasing is measured for every laser bar, and the laser beam from the laser bar is found to be polarized in the a-axis direction. The lasing wavelength is in the range of 500-530 nm.

The polarization state in the LED mode (spontaneous emission) is measured for every laser. The polarization degree ρ in Example 2 is defined by the math expression below, where I1 indicates the polarization component in the direction of the a-axis and I2 indicates the polarization component in the projected direction of the m-axis onto the primary surface:

$$\rho=(I1-I2)/(I1+I2).$$

Figure 17:
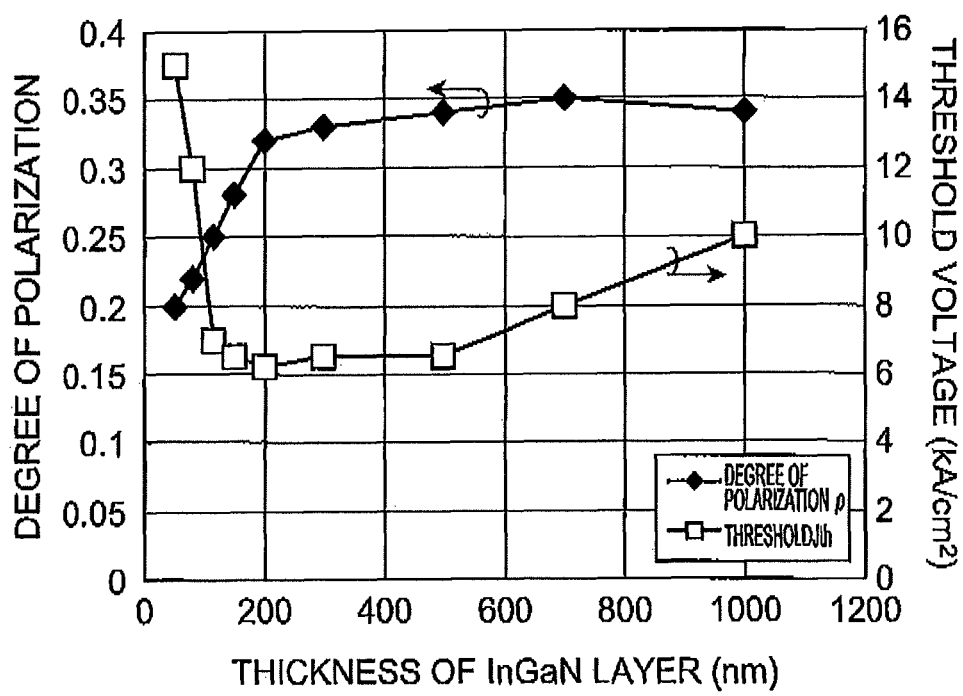
FIG. 17 is a drawing showing relations of threshold and polarization degree with thickness of InGaN layer.

A relation of determined polarization degree ρ and minimum of threshold current density is investigated. FIG. 17 is a drawing showing relations of threshold and polarization degree versus thickness of the InGaN layer.

| Thickness of InGaN, | Polarization Degree P, | Threshold Jth |
|---|---|---|
| 50, | 0.2, | 15; |
| 80, | 0.22, | 12; |
| 115, | 0.25, | 7; |
| 150, | 0.28, | 6.5; |
| 200, | 0.32, | 6.2; |
| 300, | 0.33, | 6.5; |
| 500, | 0.34, | 6.5; |
| 700, | 0.35, | 8; |
| 1000, | 0.34, | 10. |

FIG. 17 shows that the threshold voltage is low in the thickness range of the InGaN layer of not less than 100 nm and not more than 600 nm. FIG. 17 also shows that, as to the change of polarization degree, the polarization degree increases when the thickness of the InGaN layer is not less than 100 nm. This reveals that the threshold can be decreased as the polarization degree increases by growing the InGaN layer thick. In the present example, the polarization degree of the emission from the light-emitting layer is larger than zero, and therefore this laser diode can provide the polarization degree of a nonnegative value.

Figure 18:
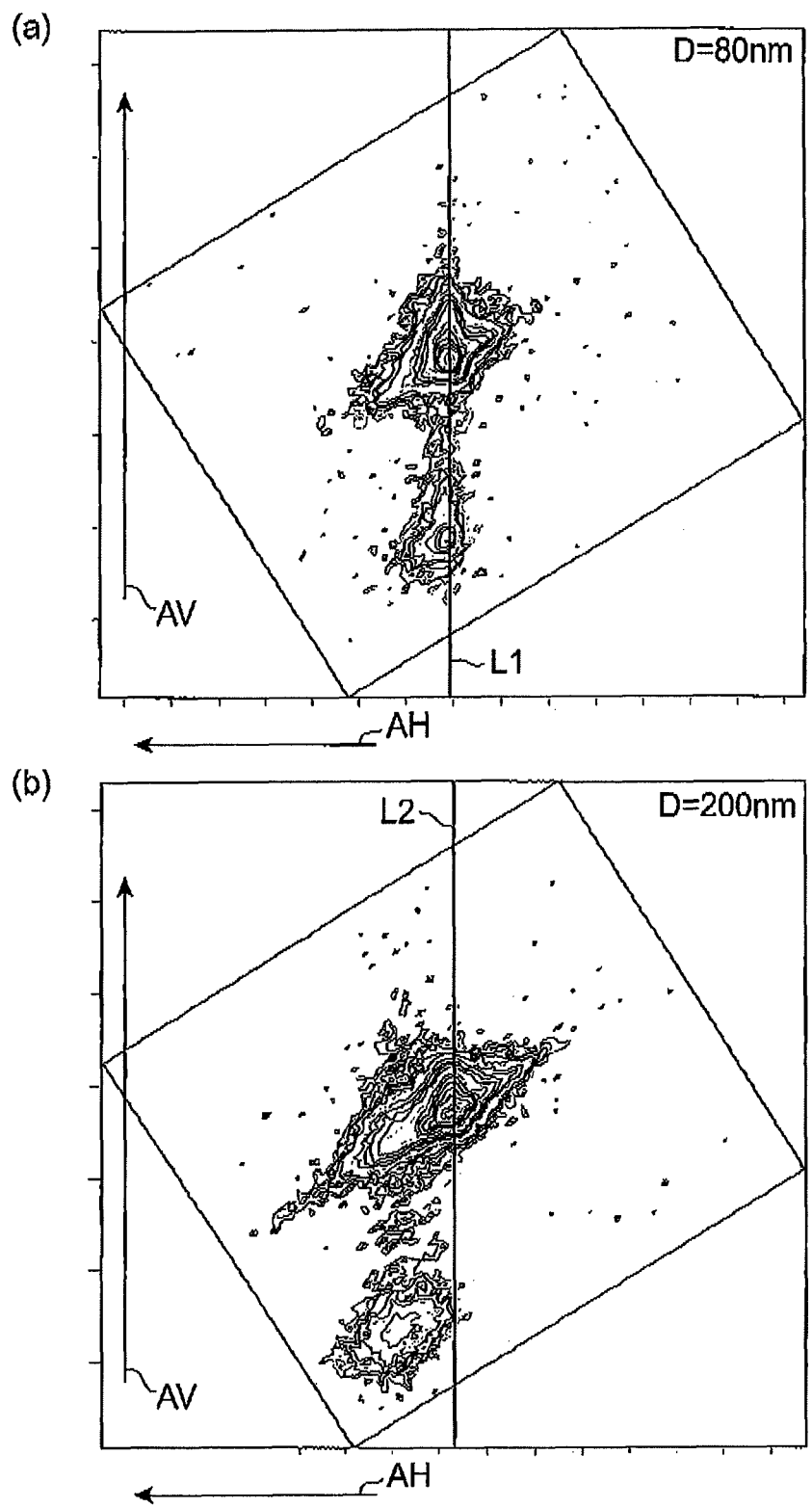
FIG. 18 is a drawing showing reciprocal lattice mapping images in thicknesses of InGaN film of 80 nm and 200 nm.

The reciprocal lattice mapping measurement of {20-24} plane is carried out in order to evaluate how strain relaxation occurs with respect to the substrate. FIG. 18 is a drawing showing the reciprocal lattice mapping results in the InGaN films of the thicknesses of 80 nm and 200 nm. In the reciprocal lattice mapping results of FIG. 18(a) and FIG. 18(b), arrow AV represents a coordinate axis of reciprocal of lattice constant in the growth direction, and arrow AH represents a coordinate axis of reciprocal of lattice constant in an in-plane direction (in a plane in which the semiconductor layer extends). In a reciprocal lattice mapping image of semiconductor layers of different compositions, plural peak signals of the mapping image appear corresponding to signals from these respective semiconductor layers. When the positions of these peak signals are arrayed on the straight line L1 that is parallel to the vertical axis, the epitaxial films of these semiconductors are coherent to the substrate (with no strain relaxation). On the contrary, when the positions of the peak signals are not arrayed on the straight line L2 that is parallel to the vertical axis, the epitaxial films of these semiconductor layers are not coherent to the substrate (with strain relaxation). FIG. 18(a) and FIG. 18(b) show the reciprocal lattice mapping results of the InGaN layers in the thicknesses of 80 nm and 200 nm, respectively. The comparison between these results reveals that the InGaN layer in the thickness of 80 nm is coherent but that the InGaN layer in the thickness of 200 nm is not coherent. It is thus found that the lattice relaxation occurs when the InGaN layer is thick.

Figure 19:
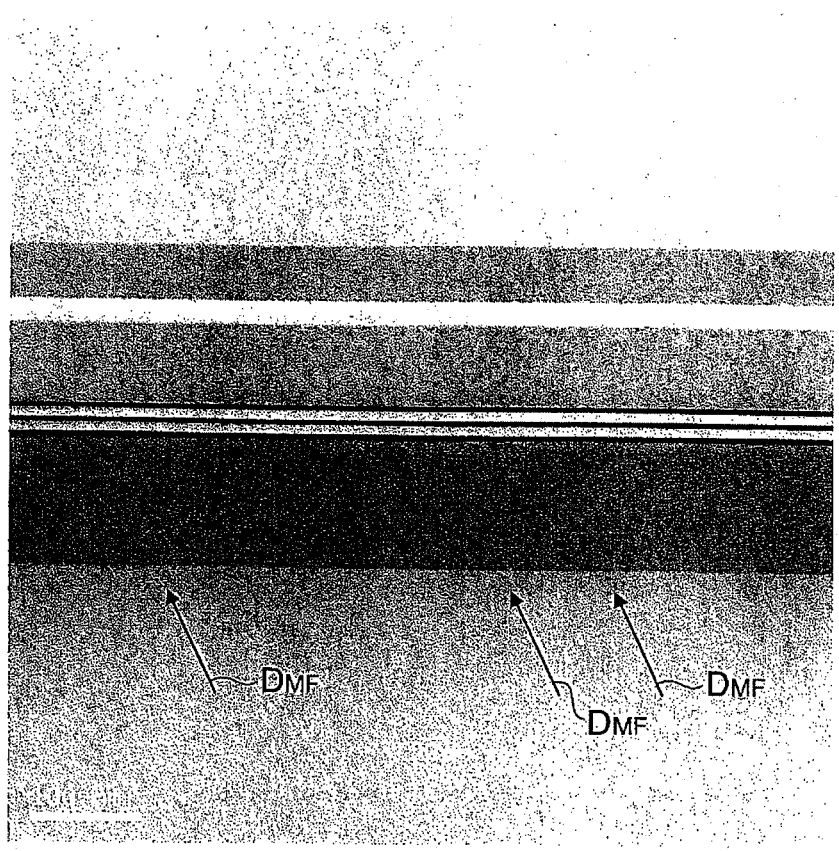
FIG. 19 is a drawing showing a transmission electron microscope image of a sample observed from an a-plane direction thereof.

Next, in order to investigate an interface at which the lattice relaxation occurs in the semiconductor laminate, transmission electron microscope observation from a cross section is carried out using a semiconductor lamination including the InGaN layer in the thickness of 115 nm as a sample. FIG. 19 is a drawing showing a transmission electron microscope image obtained by observation of the sample from the a-plane direction. This cross-sectional TEM image shows that misfit dislocations (three arrows) $D_{MF}$ are observed at the interface of InGaN guide layer/n-GaN guide layer in the thick InGaN layer of not less than 100 nm. The extending direction of the misfit dislocations is <11-20> and a line density thereof is 3 $\mu m^{-1}$. When the InGaN layer is made as thick as 100 nm or more, the introduction of misfit dislocations is observed at the interface with which the InGaN layer is in contact, and causes strain relaxation. As a result, the InGaN layer undergoes lattice deformation, and the lattice-deformed InGaN layer increases the degree of polarization.

Figure 20:
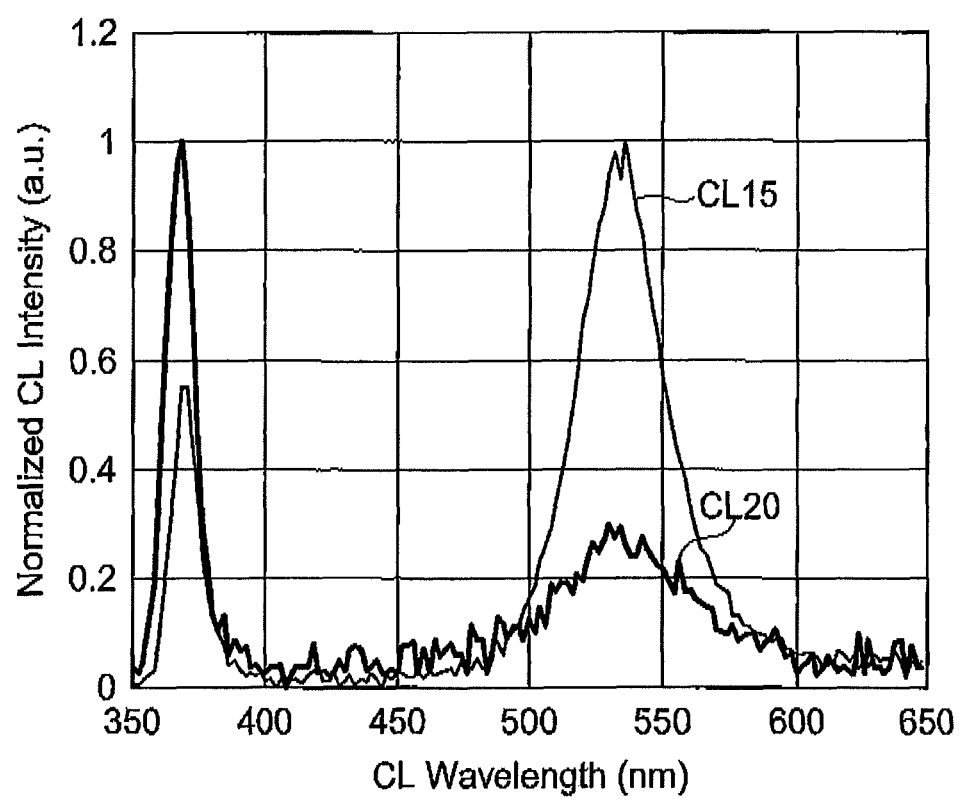
FIG. 20 is a drawing showing cathodoluminescence (CL) spectra of an epitaxial substrate in an example of the present invention.

In order to observe the dislocations generated by lattice relaxation by another method, evaluation by the cathode luminescence (CL) method from the front surface side is carried out using a sample having the InGaN layer of 115 nm thick. The CL method allows observation of an emission image of carriers excited with an electron beam and allows the investigation of influence of defects, which is observed in the transmission electron microscope image, on emission. Since the penetration depth of electron beam increases with increase in acceleration voltage, it is also possible to obtain data of information from the surface of the sample on depth direction. FIG. 20 is a drawing showing a cathode luminescence (CL) spectrum of the epitaxial substrate in the present example. Referring to FIG. 20, characteristic curve CL15 at the acceleration voltage of 15 kV is shown and characteristic curve CL20 at the acceleration voltage of 20 kV is also shown.

Estimation from the CL measurement at the acceleration voltage of 15 kV and the CL measurement at the acceleration voltage of 20 kV in FIG. 20 shows that the electron beam penetration depths are about 0.8 μm and about 1.4 μm, respectively. FIG. 21 shows CL images at the acceleration voltage of 15 kV and 20 kV. With reference to FIG. 20, since the peak wavelength of the emission spectrum at the acceleration voltage of 15 kV is 536 nm, it indicates a measured value of the CL emission from the MQW layer. FIG. 21(a) shows the CL image at the acceleration voltage of 15 kV. The CL image at the position of the MQW layer shows uniform emission. On the other hand, with reference to FIG. 20, since the peak wavelength of the emission spectrum at the acceleration voltage of 20 kV is 370 nm, it indicates a measured value of the CL emission from the InGaN optical guiding layer. FIG. 21(b) shows the CL image at the acceleration voltage of 20 kV. Dark lines in the <11-20> direction are observed in the CL image at the position of the InGaN optical guiding layer. This CL image shows that defects are formed in the InGaN optical guiding layer or at the interface thereof and that the defects propagate in the <11-20> direction, i.e., that the lattice relaxation occurs in the direction perpendicular to the <11-20> direction. In this manner, the presence/absence of lattice relaxation can also be investigated by the CL method.

The principle of the present invention has been illustrated and described in the useful embodiments, and it is understood by those skilled in the art that the present invention can be modified in arrangement and detail without departing from the principle of the invention. The present invention is by no means limited to the specific configurations described in the embodiments. Therefore, we claim all modifications and variations coming within the spirit and scope of the following claims.

INDUSTRIAL APPLICABILITY

When a light-emitting device is fabricated using the InGaN well layer coherently grown on the GaN substrate, the in-plane InGaN lattice constant of coherently grown InGaN is equal to the lattice constant of GaN, and the InGaN is elastically strained. The degree of polarization is defined by the strain of the InGaN. Hence, the degree of polarization is substantially determined by the off angle in use of a semipolar substrate. Therefore, it is difficult to make the degree of polarization high at a low off angle. Since the degree of polarization increases with decrease in symmetry of the hexagonal system, the degree of polarization can be enhanced when the anisotropic lattice relaxation can be induced.

For example, when the $In_xGa_{1-x}N$ ($0.02 \leq X \leq 0.10$) layer in the thickness of not less than 150 nm is grown on the semipolar GaN substrate, misfit dislocations are generated at the interface between the InGaN layer and the GaN region. The direction of propagation of misfit dislocations is perpendicular to the direction of inclination of the c-axis. On the other hand, when the active layer is grown on this InGaN layer, the thickness of each layer constituting the active layer is not more than the critical thickness and thus the active layer is coherently grown on the underlying InGaN layer. The anisotropy of strain therefore increases in the active layer, resulting in increase in the degree of polarization. Since the lattice mismatch is reduced between the active layer and the InGaN layer, the epitaxial growth is made easier. Furthermore, since the lattice mismatch is reduced between the active layer and the underlying InGaN layer, the piezoelectric field can be reduced.

When compared with the active layer on a c-plane GaN substrate, the lattice relaxation seems more likely to occur because of the lattice mismatch on a semipolar GaN substrate, and a (0001) plane can act as a slip plane of dislocations. Occurrence of lattice defects results in lowering luminous efficiency. In the present embodiment, the misfit dislocations are generated at the interface between the InGaN layer and the GaN region, but the misfit dislocations rarely penetrate the active layer. The model of lattice relaxation is as follows. During the epitaxial growth, a half loop of a dislocation from the surface is formed along a slip plane, the slipping dislocation forms a misfit dislocation at the interface between the InGaN layer and the GaN region, and if the In composition of the InGaN layer is larger than 0.02, the misfit dislocation moves to the interface between the InGaN layer and the GaN region and thus does not penetrate the active layer. Since the end of the half loop can reach an end of the sample, the threading dislocation does not penetrate the active layer.

Using an off GaN substrate with the off angle of 18 degrees toward the a-axis direction, an LED is produced to have an epitaxial structure of p-type GaN semiconductor layer/MQW active layer/InGaN relaxed layer/n-type GaN layer. In the composition of $In_{0.03}Ga_{0.97}N$, no lattice relaxation occurs with the InGaN layer of 50 nm. The lattice relaxation occurs with the InGaN layer of 300 nm. The degree of lattice relaxation is 25%. The lattice relaxation occurs with the InGaN layer of 1000 nm. The degree of lattice relaxation is over 100%. A conceivable reason therefor is that the lattice constant in the off direction is larger than that of strain-free InGaN and that InGaN that elastically deforms in the c-axis also extends in the off direction. The degree of polarization is measured for each of the samples and the degree of polarization increases as described above with increase in thickness of the relaxed layer.

| List of Reference Signs | |
|---|---|
| 11 | gallium nitride based light-emitting diode (light-emitting diode); |
| 13 | gallium nitride based semiconductor region (semiconductor region); |
| 13a | primary surface of semiconductor region; |
| 15 | InGaN layer; |
| 15a | primary surface of InGaN layer; |
| 17 | active layer; |
| α | inclination angle of c-axis; |
| $D_{13}$ | thickness of semiconductor region; |
| $D_{InGaN}$ | thickness of InGaN layer; |
| 21 | well layers; |
| 23 | barrier layers; |
| 25 | support base; |
| 25a | primary surface of support base; |
| $L_{GaN}$ | unit cell of strain-free GaN; |
| $L_{InGaN}$ | unit cell of strain-free InGaN; |
| $SL0_{InGaN}$ | unit cell of hexagonal InGaN grown on c-plane; |
| $SLA_{InGaN}$ | unit cell of hexagonal InGaN grown on a-plane; |
| $SLS_{InGaN}$ | unit cell of hexagonal InGaN grown on a hexagonal GaN semipolar plane inclined toward the a-axis direction; |
| $LS_{InGaN}$ | unit cell of hexagonal InGaN grown on a hexagonal GaN semipolar plane inclined toward the a-axis direction; |
| $d_{a0}, d_{m0}$ | GaN lattice constants; |
| $d_{a1}, d_{m1}$ | InGaN lattice constants; |
| 27 | n-type gallium nitride based semiconductor region; |
| 29 | p-type gallium nitride based semiconductor region; |
| 31 | electron block layer; |
| 33 | contact layer; |
| 35, 37 | electrodes; |
| 71 | GaN substrate; |
| 72 | n-type GaN layer; |
| 73 | n-type InAlGaN cladding layer; |
| 74 | n-type GaN guide layer; |
| 75 | undoped InGaN guide layer; |
| 76 | active layer; |
| 76 | p-type InGaN guide layer; |
| 77 | p-type AlGaN block layer; |
| 78 | p-type GaN guide layer; |
| 79 | p-type InAlGaN cladding layer; |
| 80 | p-type GaN contact layer; EPLD epitaxial substrate. |

The invention claimed is:

1. A gallium nitride based semiconductor light-emitting device comprising:
   a semiconductor region of a gallium nitride based semiconductor;
   an InGaN layer provided directly on a primary surface of the semiconductor region;
   an active layer comprising a well layer of InGaN, the active layer being provided on a primary surface of the InGaN layer; and a support base comprising a hexagonal gallium nitride and having a primary surface, the primary surface of the support base being inclined at an angle of not less than 10 degrees and not more than 80 degrees with respect to a plane perpendicular to a reference axis, and the reference axis extending in a direction of a [0001] axis of the gallium nitride, the InGaN layer being provided between the active layer and the semiconductor region, the primary surface of the semiconductor region being inclined to have semipolar nature and being inclined with respect to a plane perpendicular to an axis which extends in a direction of a [0001] axis in the primary surface thereof, the semiconductor region comprising one or more gallium nitride based semiconductor layers, each gallium nitride based semiconductor layer comprising one of GaN, AlGaN, InGaN and InAlGaN, a material of the primary surface of the semiconductor region being different from that of the InGaN layer, a thickness of the semiconductor region being larger than a thickness of the InGaN layer, the thickness of the InGaN layer being not less than 100 nm, the semiconductor region being provided on the primary surface of the support base, the InGaN layer having a first InGaN lattice constant in a first direction perpendicular to the reference axis and a second InGaN lattice constant in a second direction perpendicular to the reference axis, the first direction being perpendicular to the second direction, the support base having a first GaN lattice constant in a first direction perpendicular to the reference axis thereof and a second GaN lattice constant in a second direction perpendicular to the reference axis thereof, the first InGaN lattice constant being equal to the first GaN lattice constant, and the second InGaN lattice constant being different from the second GaN lattice constant.

2. The gallium nitride based semiconductor light-emitting device according to claim 1, wherein the InGaN layer has a thickness of not less than 150 nm.

3. The gallium nitride based semiconductor light-emitting device according to claim 1,
wherein the gallium nitride based semiconductor light-emitting device comprises a semiconductor laser,
wherein an optical guiding layer of the semiconductor laser comprises the InGaN layer,
the gallium nitride based semiconductor light-emitting device further comprising another optical guiding layer, the other optical guiding layer comprising another InGaN layer and being provided on a primary surface of the active layer.

4. The gallium nitride based semiconductor light-emitting device according to claim 1, wherein the primary surface of the semiconductor region comprises GaN.

5. The gallium nitride based semiconductor light-emitting device according to claim 1, wherein an inclination angle of the primary surface of the support base is not less than 63 degrees and not more than 80 degrees with respect to the plane perpendicular to the reference axis, and the reference axis extending in a direction of a [0001] axis of the gallium nitride.

6. The gallium nitride based semiconductor light-emitting device according to claim 1, wherein misfit dislocations are generated at an interface between the semiconductor region and the InGaN layer to induce lattice relaxation in the InGaN layer.

7. The gallium nitride based semiconductor light-emitting device according to claim 6, wherein the misfit dislocations induce anisotropic lattice relaxation in the InGaN layer in which lattice relaxation occurs in a direction to which the reference axis is inclined and no lattice relaxation occurs in a direction perpendicular to the reference axis and the direction to which the reference axis is inclined.

8. The gallium nitride based semiconductor light-emitting device according to claim 1, wherein an indium composition of the InGaN layer is not less than 0.02 and not more than 0.10, and
wherein the indium composition of the InGaN layer is smaller than an indium composition of the well layer.

9. The gallium nitride based semiconductor light-emitting device according to claim 1, the gallium nitride based semiconductor light-emitting device comprising a semiconductor laser,
wherein an optical waveguide of the semiconductor laser extends in an inclination direction of the c-axis.

10. The gallium nitride based semiconductor light-emitting device according to claim 1, wherein the reference axis is inclined in a direction defined in a range of not less than −15 degrees and not more than +15 degrees with respect to the <1-100> direction of the gallium nitride of the support base.

11. The gallium nitride based semiconductor light-emitting device according to claim 1, wherein the reference axis is inclined in a direction defined in a range of not less than −15 degrees and not more than +15 degrees with respect to the <11-20> direction of the gallium nitride of the support base.

12. The gallium nitride based semiconductor light-emitting device according to claim 1, wherein a threading dislocation density of the support base is not more than $1\times10^7\,\mathrm{cm}^{-2}$ in a c-plane thereof.

13. The gallium nitride based semiconductor light-emitting device according to claim 1, wherein the thickness of the InGaN layer is not less than 300 nm.

14. The gallium nitride based semiconductor light-emitting device according to claim 1, wherein the thickness of the InGaN layer is not less than 1000 nm.

15. The gallium nitride based semiconductor light-emitting device according to claim 1, wherein a degree of polarization in emission from the active layer is larger than zero.

16. An epitaxial wafer for a gallium nitride based semiconductor light-emitting device, comprising:
a substrate comprising a hexagonal gallium nitride and having a primary surface, the primary surface being inclined at an angle of not less than 10 degrees and not more than 80 degrees with respect to a plane perpendicular to a reference axis, and the reference axis extending in a direction of a [0001] axis of the gallium nitride;
a semiconductor region comprising one or more gallium nitride based semiconductor layers;
an InGaN layer provided directly on a primary surface of the semiconductor region;
an active layer comprising a well layer of InGaN and provided on the primary surface of the substrate; and
the InGaN layer being provided between the active layer and the semiconductor region,
the primary surface of the semiconductor region being inclined to have semipolar nature and being inclined with respect to a plane perpendicular to an axis which extends in a direction of a [0001] axis in the primary surface thereof, the semiconductor region comprising one or more gallium nitride based semiconductor layers, each gallium nitride based semiconductor layer comprising one of GaN, AlGaN, InGaN and InAlGaN, a material of the primary surface of the semiconductor region being different from that of the InGaN layer, a thickness of the semiconductor region being larger than a thickness of the InGaN layer, the thickness of the InGaN layer being not less than 100 nm, the semiconductor region being provided on the primary surface of the substrate, the InGaN layer having a first InGaN lattice constant in a first direction perpendicular to the reference axis and a second InGaN lattice constant in a second direction perpendicular to the reference axis, the first direction being perpendicular to the second direction, the substrate having a first GaN lattice constant in a first direction the reference axis thereof and a second GaN lattice constant in a second direction perpendicular to the reference axis thereof, the first InGaN lattice constant being equal to the first GaN lattice constant, and the second InGaN lattice constant being different from the second GaN lattice constant.

17. A method for fabricating a gallium nitride based semiconductor light-emitting device, the method comprising the steps of:

preparing a substrate of a hexagonal gallium nitride, the substrate having a primary surface, the primary surface being inclined at an angle of not less than 10 degrees and not more than 80 degrees with respect to a plane perpendicular to a reference axis, and the reference axis extending in a direction of a [0001] axis of the gallium nitride;

growing a semiconductor region on the substrate, the semiconductor region comprising a gallium nitride based semiconductor and having a primary surface, and the primary surface having semipolar nature;

growing an InGaN layer directly on the primary surface of the semiconductor region, the InGaN layer having a thickness of not less than 100 nm, and the InGaN layer including anisotropic lattice relaxation; and growing an active layer on a primary surface of the InGaN layer, the active layer comprising a well layer of InGaN, the primary surface of the semiconductor region being inclined with respect to a plane perpendicular to an axis which extends in a direction of a [0001] axis in the primary surface thereof, the semiconductor region comprising one of GaN, AlGaN, InGaN and InAlGaN, a material of the primary surface of the semiconductor region being different from the InGaN layer, the InGaN layer having a first InGaN lattice constant in a first direction perpendicular to the reference axis and a second InGaN lattice constant in a second direction perpendicular to the reference axis, the first direction being perpendicular to the second direction, the substrate having a first GaN lattice constant in a first direction perpendicular to the reference axis thereof and a second GaN lattice constant in a second direction perpendicular to the reference axis thereof, the first InGaN lattice constant being equal to the first GaN lattice constant, the second InGaN lattice constant being different from the second GaN lattice constant, and a thickness of the semiconductor region being larger than a thickness of the InGaN layer.

18. A gallium nitride based light-emitting diode comprising:

a semiconductor region of a gallium nitride based semiconductor;

an InGaN layer provided directly on a primary surface of the semiconductor region;

an active layer comprising a well layer of InGaN and provided on a primary surface of the InGaN layer; and a support base, the support base including a hexagonal gallium nitride and having a primary surface inclined with respect to a plane perpendicular to a reference axis which extends in a direction of a [0001] axis of the gallium nitride, the InGaN layer being provided between the active layer and the semiconductor region, the primary surface of the semiconductor region being inclined to have semipolar nature and being inclined with respect to a plane perpendicular to an axis which extends in a direction of a [0001] axis in the primary surface thereof, the semiconductor region comprising one or more gallium nitride based semiconductor layers, each gallium nitride based semiconductor layer comprising one of GaN and AlGaN, a thickness of the semiconductor region being larger than a thickness of the InGaN layer, the thickness of the InGaN layer being not less than 150 nm, and the semiconductor region being provided on the primary surface of the support base, the first InGaN layer having a first InGaN lattice constant in a first direction perpendicular to the reference axis and a second InGaN lattice constant in a second direction perpendicular to the reference axis, the first direction being perpendicular to the second direction, the support base having a first GaN lattice constant in the first direction perpendicular to the reference axis thereof and a second GaN lattice constant in the second direction perpendicular to the reference axis thereof, the first InGaN lattice constant being equal to the first GaN lattice constant, and the second InGaN lattice constant being different from the second GaN lattice constant.

19. The gallium nitride based light-emitting diode according to claim 18, wherein the primary surface of the semiconductor region is comprised of GaN, and wherein an angle of the inclination is not less than 10 degrees and not more than 80 degrees.

20. The gallium nitride based light-emitting diode according to claim 18, wherein the reference axis is inclined in a direction defined in a range of not less than −15 degrees and not more than +15 degrees with respect to a <1-100> direction of the gallium nitride of the support base.

21. The gallium nitride based light-emitting diode according to claim 18, wherein the reference axis is inclined in a direction defined in a range of not less than −15 degrees and not more than +15 degrees with respect to a <11-20> direction of the gallium nitride of the support base.

22. The gallium nitride based light-emitting diode according to claim 18, wherein an indium composition of the InGaN layer is not less than 0.02 and not more than 0.10, and wherein the indium composition of the InGaN layer is smaller than an indium composition of the well layer.

23. The gallium nitride based light-emitting diode according to claim 18, wherein misfit dislocations are generated at an interface between the semiconductor region and the InGaN layer to induce lattice relaxation in the InGaN layer.

24. The gallium nitride based light-emitting diode according to claim 23, wherein a threading dislocation density of the support base is not more than $1 \times 10^7$ cm$^{-2}$ in a c-plane thereof.

25. The gallium nitride based light-emitting diode according to claim 23, wherein the misfit dislocations induce anisotropic lattice relaxation in the InGaN layer in which lattice relaxation occurs in a direction to which the reference axis is inclined, and no lattice relaxation occurs in a direction perpendicular to the reference axis and the direction to which the reference axis is inclined.

26. The gallium nitride based light-emitting diode according to claim 18, wherein a thickness of the InGaN layer is not less than 300 nm.

27. The gallium nitride based light-emitting diode according to claim 18, wherein a thickness of the InGaN layer is not less than 1000 nm.

28. An epitaxial wafer for a gallium nitride based light-emitting diode, comprising:
a substrate comprising a hexagonal gallium nitride and having a primary surface, the primary surface being inclined with respect to a plane perpendicular to a reference axis which extends in a direction of a [0001] axis of the gallium nitride;
a semiconductor region comprising one or more gallium nitride based semiconductor layers;
an InGaN layer provided directly on a primary surface of the semiconductor region; and
an active layer comprising a well layer of InGaN and provided above the primary surface of the support base,
the semiconductor region being provided between the support base and the InGaN layer,
the InGaN layer being provided between the active layer and the semiconductor region,
each gallium nitride based semiconductor layer comprising one of GaN or AlGaN,
a thickness of the semiconductor region being larger than a thickness of the InGaN layer, and
the InGaN layer having a thickness of not less than 150 nm
the semiconductor region being provided on the primary surface of the substrate,
the first InGaN layer having a first InGaN lattice constant in a first direction perpendicular to the reference axis and a second InGaN lattice constant in a second direction perpendicular to the reference axis,
the first direction being perpendicular to the second direction,
the substrate having a first GaN lattice constant in the first direction perpendicular to the reference axis thereof and a second GaN lattice constant in the second direction perpendicular to the reference axis thereof,
the first InGaN lattice constant being equal to the first GaN lattice constant, and
the second InGaN lattice constant being different from the second GaN lattice constant.

29. A method for fabricating a gallium nitride based light-emitting diode, comprising the steps of:
growing an InGaN layer directly on a primary surface, the primary surface of a semiconductor region of a gallium nitride based semiconductor having semipolar nature, and the InGaN layer having a thickness of not less than 150 nm; and
growing an active layer on a primary surface of the InGaN layer,
the InGaN layer including anisotropic lattice relaxation,
the active layer comprising a well layer of InGaN,
the primary surface of the semiconductor region being inclined with respect to a plane perpendicular to a reference axis which extends in a direction of a [0001] axis in the primary surface,
the semiconductor region comprising one of GaN and AlGaN, and
a thickness of the semiconductor region being larger than the thickness of the InGaN layer.

30. The method according to claim 29, wherein the primary surface of the InGaN layer has a streaky morphology extending in a direction which intersects with a direction of the inclination of the reference axis.

* * * * *